United States Patent [19]

Chiba

[11] Patent Number: 5,422,921
[45] Date of Patent: Jun. 6, 1995

[54] X-RAY MASK STRUCTURE AND MANUFACTURING METHODS INCLUDING FORMING A METAL OXIDE FILM ON A PORTION OF AN X-RAY PERMEABLE FILM HAVING NO X-RAY ABSORBER THEREON

[75] Inventor: Keiko Chiba, Isehara, Japan

[73] Assignee: Canon Kabushiki Kaisha, Tokyo, Japan

[21] Appl. No.: 975,521

[22] Filed: Nov. 12, 1992

[30] Foreign Application Priority Data

Nov. 15, 1991 [JP] Japan .................. 3-326716
Nov. 15, 1991 [JP] Japan .................. 3-326717
Jun. 30, 1992 [JP] Japan .................. 4-194672

[51] Int. Cl.⁶ .................. G21K 5/00; G11B 11/00; H01L 39/00
[52] U.S. Cl. .................. 378/34; 378/35; 430/5
[58] Field of Search ............. 378/34, 35; 430/5, 311

[56] References Cited

U.S. PATENT DOCUMENTS

| | | | |
|---|---|---|---|
| 3,742,230 | 6/1973 | Spears et al. | 250/65 |
| 4,152,601 | 5/1979 | Kadota et al. | 250/505 |
| 4,178,403 | 12/1979 | Sakurai et al. | 428/209 |
| 4,468,799 | 8/1984 | Harms et al. | 378/35 |
| 4,647,517 | 3/1987 | Hersener et al. | 430/5 |
| 4,735,877 | 4/1988 | Kato et al. | 430/5 |
| 5,057,388 | 10/1991 | Yahalom | 430/5 |
| 5,115,456 | 5/1992 | Kimura et al. | 378/35 |
| 5,132,186 | 7/1992 | Takeuchi et al. | 378/35 |
| 5,178,977 | 1/1993 | Yamada et al. | 378/35 |
| 5,196,283 | 3/1993 | Ikeda et al. | 378/35 |
| 5,224,139 | 6/1993 | Korenaga et al. | 378/35 |
| 5,247,557 | 9/1993 | Ikeda | 378/35 |
| 5,291,536 | 3/1994 | Itoh et al. | 378/34 |
| 5,334,466 | 8/1994 | Yasui et al. | 378/34 |
| 5,335,256 | 8/1994 | Maruyama et al. | 378/34 |

FOREIGN PATENT DOCUMENTS

| | | |
|---|---|---|
| 0049799 | 4/1982 | European Pat. Off. . |
| 0069265 | 1/1983 | European Pat. Off. . |
| 0082977 | 7/1983 | European Pat. Off. . |
| 0167948 | 7/1986 | European Pat. Off. . |
| 0231916 | 8/1987 | European Pat. Off. . |
| 0408349 | 1/1991 | European Pat. Off. . |
| 2506036 | 11/1982 | France . |

OTHER PUBLICATIONS

Patent Abstracts of Japan, Kokai No. 62-020310, vol. 11, No. 190, Jun. 1987.
Behringer, et al., "Mask For X-Ray Lithography With Optically Transparent Registration Window," IBM Technical Disclosure Bulletin, vol. 25, No. 6, Nov. 1982, p. 2733.

*Primary Examiner*—Georgia Y. Epps
*Assistant Examiner*—Kim-Kwok Chu
*Attorney, Agent, or Firm*—Fitzpatrick, Cella, Harper & Scinto

[57] ABSTRACT

An X-ray mask structure includes an X-ray absorber having a masking pattern, an X-ray permeable film for supporting the X-ray absorber on a surface of the X-ray permeable film, and a supporting frame for supporting the X-ray permeable film. The X-ray mask structure has a metal oxide film formed on a portion of the surface of the X-ray permeable film having no X-ray absorber thereon. Also disclosed is a method for manufacturing such an X-ray mask structure.

65 Claims, 19 Drawing Sheets

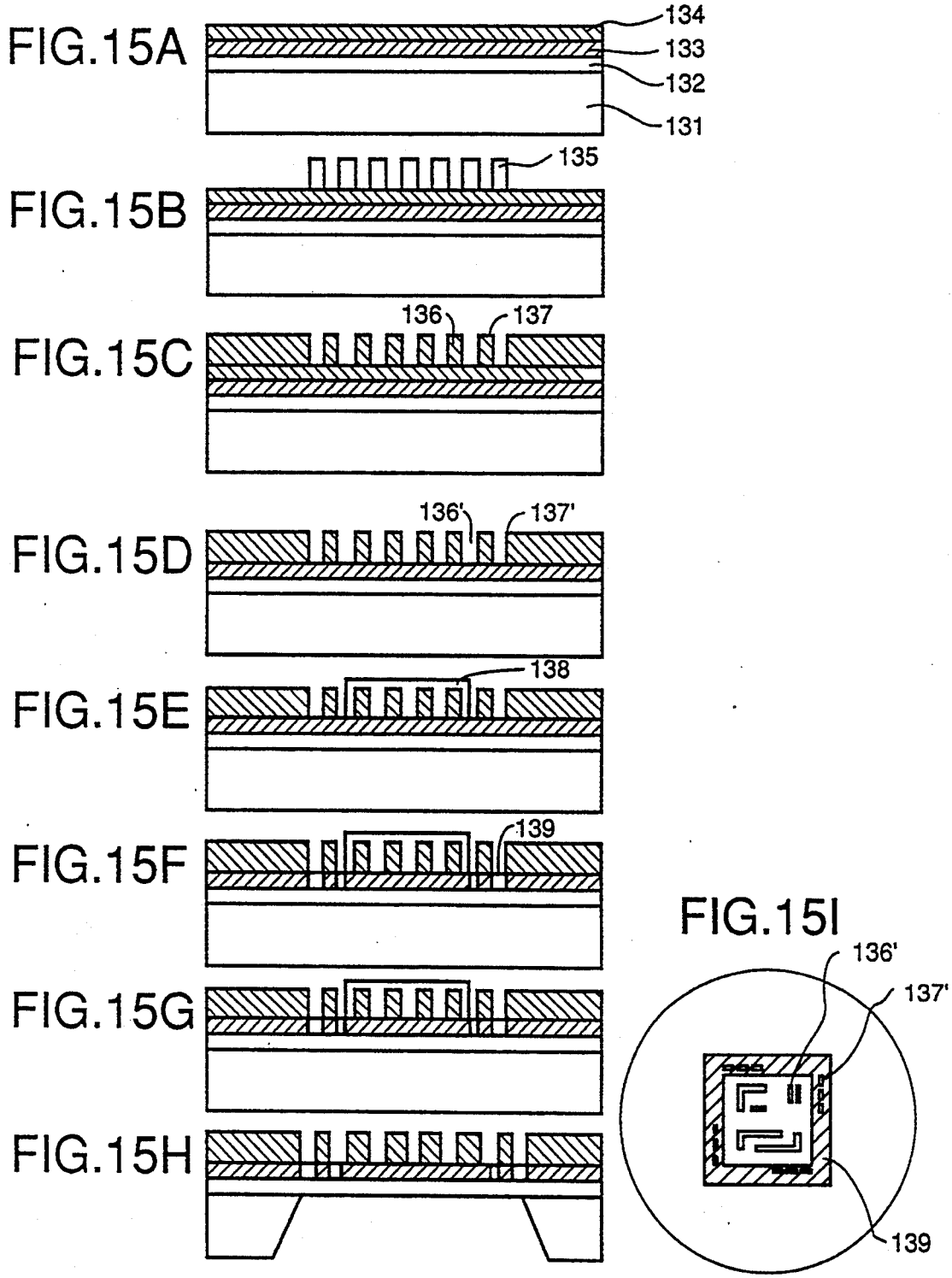

X-RAY MASK STRUCTURE AND MANUFACTURING METHODS INCLUDING FORMING A METAL OXIDE FILM ON A PORTION OF AN X-RAY PERMEABLE FILM HAVING NO X-RAY ABSORBER THEREON

BACKGROUND OF THE INVENTION

1. Field of the Invention

The present invention relates to an X-ray mask structure for use in the manufacture of semiconductor devices and the like, an X-ray exposing method by the use of the X-ray mask structure, a semiconductor device manufactured by the use of the X-ray mask structure, and a method for manufacturing the X-ray mask structure.

2. Related Background Art

In recent years, there has been a tendency that each line width of patterns on Integrated circuits is reduced as much as 70% in about three years time, with the increase of density and processing speed of the semiconductor integrated circuits. Due to the further integration of large capacity memory elements, further improvement in the performance of associated printing equipment is also required. Thus, this has begun to demand such a high performance that a transferable minimum line width is 0.3 μm or less.

Therefore, a stepper utilizing light in an X-ray region (2 to 20 Å) as exposure wavelength light is being developed. An X-ray mask structure for use in such X-ray exposing equipment has heretofore possessed such a constitution as shown in FIG. 19F formed by a manufacturing process elucidated in FIGS. 19A to 19F. In this structure, nothing is formed on the portion of an X-ray permeable film having no X-ray absorber pattern thereon.

In detail, reference numeral 21 is a substrate which will be a supporting frame, and as the substrate, an Si wafer is often used. As an X-ray permeable film 22, there is used a thin film having a thickness of about 2 μm and comprising silicon nitride, silicon carbide or the like which is excellent in X-ray permeability.

A chromium film having a thickness of 50 Å as a metal thin film 23 for gold adhesion and a gold film having a thickness of 500 Å as a plating electrode 24 for the formation of an X-ray absorber are continuously deposited by EB vacuum deposition, as shown in FIG. 19A.

On the plating electrode 24, a desired fine resist pattern 25 is formed by means of an electron ray depictor, as shown in FIG. 19B. The resist to be used may have a single-layer form or a multi-layer form.

Next, gold is plated to form a gold film which will be an X-ray absorber 26. The resist pattern 25 is then peeled off, as shown in FIG. 19C.

The portion of the plating electrode 24 having no X-ray absorber 26 thereon is peeled off by etching with an argon gas. In this case, the plating electrode 24 and the X-ray absorber which are both made of gold are equally etched, so that the X-ray absorber takes such a form as represented by numeral 26' in FIG. 19D.

Afterward, the portion of the chromium thin film 23 having no X-ray absorber 26' thereon is peeled off by sputtering-etching with an argon gas or by etching with a reactive gas (a chlorine-based gas), as shown in FIG. 19E.

In the last step, the back of the Si wafer is etched to form the supporting frame 21, as shown in FIG. 19F.

In the conventional manufacturing process of the X-ray mask structure, the thickness reduction of the gold film is large and so the contrast of the X-ray mask structure is poor, because a sputtering ratio of chromium is lower as compared with that of gold, when the portion of the chromium thin film 23 having no X-ray absorber 26' thereon is peeled off by the sputtering-etching with the argon gas.

A difficulty in the manufacture process of the X-ray mask structure resides in that a fine pattern (on a level of 0.25 μm) having a thickness of about 0.75 μm and a high aspect ratio must be formed to obtain a desired contrast. It makes it more difficult to form a little thicker gold film in consideration of a film thickness quantity which is reduced at the time of the etching of chromium. Furthermore, in the case of the etching manner using the reactive gas, the chlorine-based gas is used, and therefore even if the uneven state of the etching is slight, silicon nitride or silicon carbide which is the X-ray permeable film is inconveniently etched, so that film thickness non-uniformity takes place and the film surface suffers damage. Even in the case of the sputtering-etching manner using the argon gas, the film thickness non-uniformity occurs and the film surface suffers damage.

Furthermore, when the metal thin film remains, this remaining film has little influence on the X-ray permeability but largely reduces alignment light permeability. In the case that the chromium film having a thickness of 50 Å remains, the X-ray permeability deteriorates as slightly as 0.6%, but the alignment light permeability (with an He-Ne laser) lowers by as much as 46%.

Moreover, the X-ray absorber can be formed by etching W or Ta, but in this case, the reactive gases (mainly comprising fluorine) are used. Most of these gases have a high etching grade for silicon nitride or silicon carbide constituting the X-ray permeable film, so that the film thickness non-uniformity takes place and the film surface suffers damage. For the prevention of these troubles, a metal thin film for an etching stopper can be formed, and the film thickness non-uniformity and the damage can be inhibited as much as the thickness of the thin film, but nevertheless, similar problems are still present.

SUMMARY OF THE INVENTION

A main object of the present invention is to provide an X-ray mask structure which can prevent alignment light from reflecting and which has good alignment light permeability, and a method for manufacturing the X-ray mask structure.

Furthermore, another object of the present invention is to provide an X-ray mask structure which can solve the problems of the above-mentioned conventional example, has an X-ray absorber pattern with a sufficient contrast, even if a metal thin film is interposed between an X-ray permeable film and a metal capable of playing a main role as the X-ray absorber in a manufacturing process of the X-ray mask structure, and can inhibit most of the film thickness non-uniformity and the damage of the X-ray permeable film and in which the portion of the X-ray permeable having no pattern thereon has good alignment light permeability; and a method for manufacturing the X-ray mask structure.

Still another object of the present invention is to provide an X-ray exposing method by which a pattern can be transferred highly precisely to a material to be exposed, and a highly precise semiconductor device manufactured by this X-ray exposing method.

The above-mentioned objects can be achieved by the present invention.

A first aspect of the present invention is directed to an X-ray mask structure comprising an X-ray absorber having a desired pattern, an X-ray permeable film supporting the X-ray absorber, and a supporting frame for supporting the X-ray permeable film, said X-ray mask structure being characterized in that a metal oxide film is formed on the portion of the X-ray permeable film having no X-ray absorber thereon.

A second aspect of the present invention is directed to an X-ray mask structure comprising an X-ray absorber having a desired pattern, an alignment mark, an X-ray permeable film supporting the X-ray absorber and the mark, and a supporting frame for supporting the X-ray permeable film, said X-ray mask structure being characterized in that a metal oxide film is formed on at least the portion of the X-ray permeable film in the vicinity of the mark and having no X-ray absorber thereon.

A third aspect of the present invention is directed to an X-ray exposing method which comprises the step of Irradiating a material to be exposed with X-rays through the above-mentioned X-ray mask structure.

A fourth aspect of the present invention is directed to a semiconductor device manufactured by irradiating a material to be exposed with X-rays through the above-mentioned X-ray mask structure to form a circuit pattern on the material to be exposed.

A fifth aspect of the present invention is directed to a method for manufacturing an X-ray mask structure comprising an X-ray absorber having a desired pattern, an X-ray permeable film supporting the X-ray absorber, and a supporting frame for supporting the X-ray permeable film, said method being characterized by including a process in which after the formation of an X-ray absorber pattern, the portion of the X-ray permeable film having no X-ray absorber pattern thereon is oxidized.

A sixth aspect of the present invention is directed to a method for manufacturing an X-ray mask structure comprising an X-ray absorber having a desired pattern, an X-ray permeable film supporting the X-ray absorber, and a supporting frame for supporting the X-ray permeable film, said method being characterized by including:

(a) a process for forming a metal film on the X-ray permeable film, (b) a process for forming an X-ray absorber pattern on the metal film, and (c) a process in which after the formation of the X-ray absorber pattern, the portion of the metal film having no X-ray absorber pattern thereon is oxidized.

BRIEF DESCRIPTION OF THE DRAWINGS

FIGS. 15A to 15I illustrate a twelfth example of an X-ray mask structure manufacturing process of the present invention.

DETAILED DESCRIPTION OF THE PREFERRED EMBODIMENTS

Figure 1A:
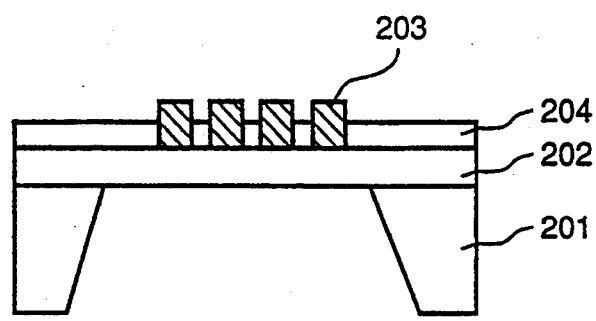
FIGS. 1A and 1B illustrate an example of a mask structure of the present invention.
Figure 1B:
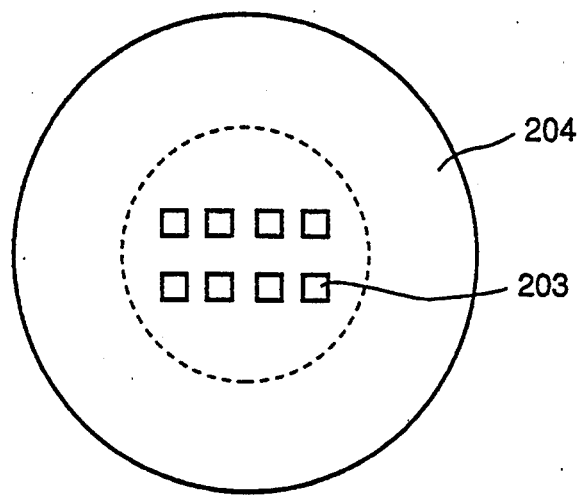

As shown in FIG. 1A (a sectional view) and FIG. 1B (a plan view), an X-ray mask structure of the present invention is characterized by forming a metal oxide film 204 on the portion of an X-ray permeable film 202 having no X-ray absorber 203 thereon.

In the present invention, the metal oxide film 204 mainly functions to prevent alignment light from reflecting at the time of the alignment of a material to be exposed to the X-ray mask structure.

Furthermore, in the present invention, the metal oxide film 204 is not interposed between the X-ray permeable film 202 and the X-ray absorber 203, and therefore adhesive properties between these films 202 and 203 are excellent, whereby the peeling off of the X-ray absorber 203 can be prevented.

Here, the thickness of the metal oxide film 204 is preferably from 8 Å to 1000 Å, more preferably 20 Å to 800 Å so as not to extremely lower the permeability of the alignment light and so as to exert a further excellent effect as the reflection preventing film. In addition, the metal oxide film 204 can be made of an oxide of a metal element having an atomic number of 35 or less, particularly an oxide of at least one metal selected from the group consisting of chromium, titanium, aluminum, zinc, copper and nickel.

Figure 2:
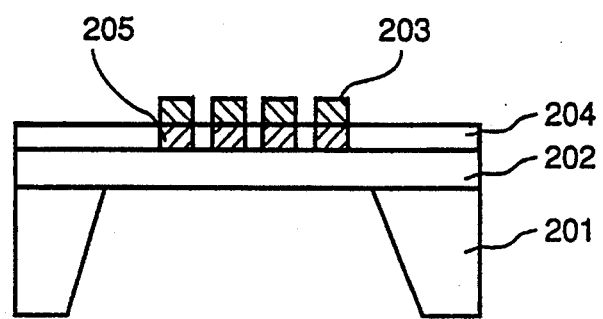
FIG. 2 illustrates another example of a mask structure of the present invention.

The X-ray mask structure of the present invention preferably has an intermediate layer 205 for the further improvement of the adhesive properties between the X-ray permeable film 202 and the X-ray absorber 203, in addition to the metal oxide film 204, as shown in FIG. 2 (a sectional view).

In the present invention, the material of the intermediate layer 205 can be selected, considering not only the materials of the X-ray absorber 203 and the X-ray permeable film 202 but also mainly the material of the metal oxide film 204. That is, the intermediate layer 205 preferably comprises the metal element of the metal oxide constituting the metal oxide film 204 in view of the homogeneity of the films (the metal oxide film 204 and the intermediate layer 205) formed on the X-ray permeable film 202.

The X-ray absorber 203 which is one constitutional requirement of the X-ray mask structure of the present invention can be made of a conventional, known material, but preferably, it is made of a metal having an atomic number of 70 or more which has a large X-ray absorbency, particularly a metal such as tantalum, tungsten, lead, gold or platinum.

The X-ray permeable film 202 can be made of one or an optional combination of Be, B, C, N, Al, Si and the like through which the X-rays can permeate, but it is preferred that the film 202 is made of SiN, SiC or the like in view of Young's modulus, the thermal expansion coefficient, visible permeability and the like. No particular restriction is put on the thickness of the X-ray permeable film, but it is preferably in the range of 1 to 3 $\mu$m, more preferably 1 to 2 $\mu$m.

In the X-ray mask structure of the present invention, a supporting frame 201 for supporting the X-ray permeable film 202 can be formed into an annular shape generally from single crystal silicon. The supporting frame may be adhered to be fixed to a retaining frame, for example, for reinforcement. As a material of the retaining frame, there can be used glass materials such as Pyrex, metal materials such as titanium, stainless steel, etc. or ceramic materials such as alumina, silicon carbide, etc.

In the X-ray mask structure of the present invention, the metal oxide film is formed at least in the vicinity of the alignment mark which is utilized for the alignment between the material to be exposed and the X-ray mask structure, but as shown in FIGS. 1A, 1B and 2, the metal oxide film 204 can be formed all over the surface of the X-ray permeable film 202 except the portions covered with the X-ray absorber 203. This constitution is particularly preferable, because metal film or metal oxide film present in the X-ray absorber patterned region can prevent the positional deviation of the X-ray absorber due to a stress change with time of the X-ray permeable film attributed to the oxidation of the X-ray permeable film with X-ray irradiation. That is, the metal oxide film 204 functions as a barrier layer for preventing the oxidation with time of the X-ray permeable film.

The X-ray mask structure of the present invention preferably has the metal oxide film also on the surface of the X-ray absorber. When the positional precision of a pattern is measured by means of light wave interference system coordinate measuring equipment, for example, and some displacement is found from the design value for the mask pattern, the absorber pattern surface may be subjected to oxidation treatment to change slightly the inner stress of the absorber pattern, thereby correcting the displacement. The metal oxide film thus formed on the surface of the X-ray absorber functions to prevent the stress change caused by the oxidation with time of the X-ray absorber. That is, the metal oxide film is particularly preferable in that it functions as an oxidation barrier layer of the X-ray absorber to thereby prevent the positional deviation of the X-ray absorber attributed to the stress change with time.

Also in this case, the material of the metal oxide film is preferably an oxide of a metal element mainly constituting the X-ray absorber in view of the homogeneity with the X-ray absorber.

Next, reference will briefly be made to an X-ray exposure method using the above-mentioned X-ray mask structure.

Figure 18:
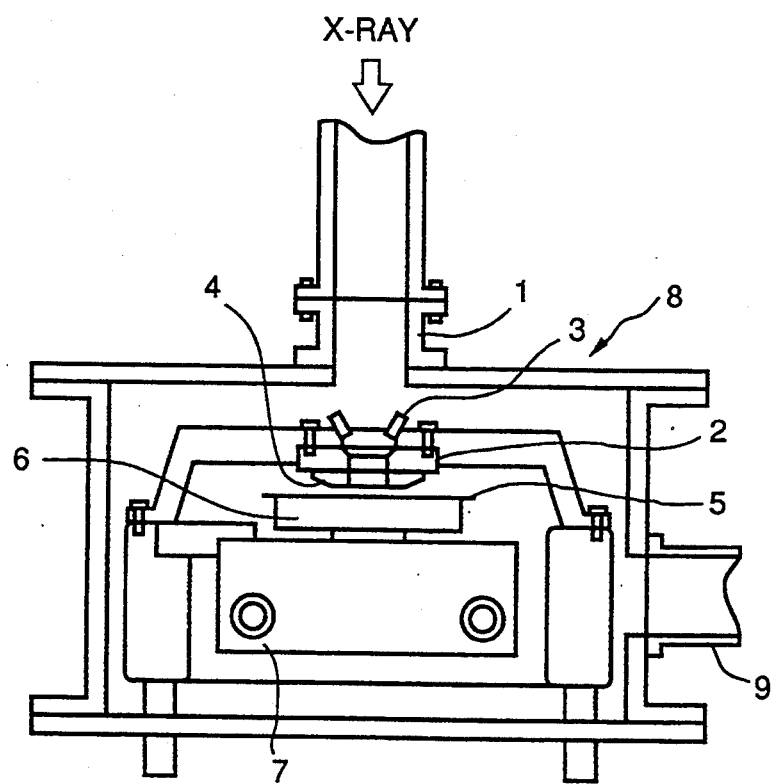
FIG. 18 is a schematic view of an X-ray exposing equipment.
Figure 19A:
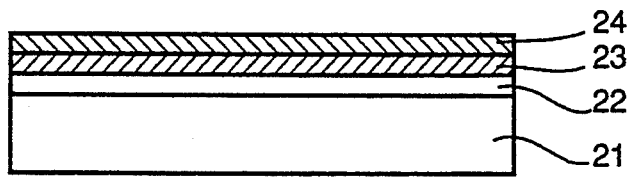
FIGS. 19A to 19F illustrate a conventional X-ray mask structure manufacturing process.
Figure 19B:
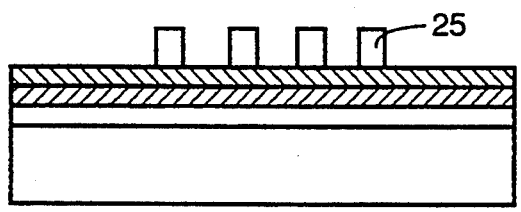
Figure 19C:
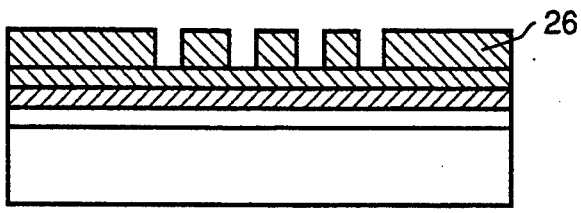
Figure 19D:
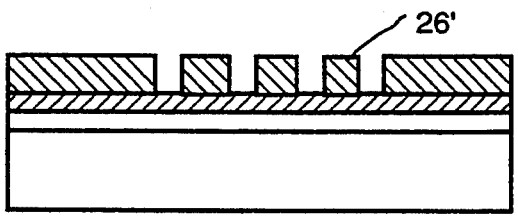
Figure 19E:
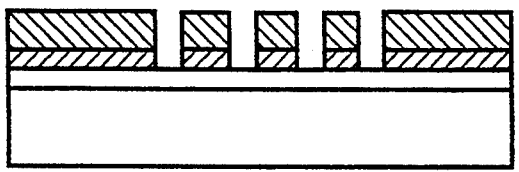
Figure 19F:
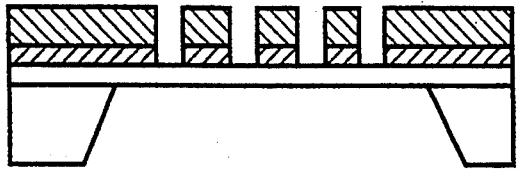

FIG. 18 is a schematic view of an X-ray exposing equipment, and reference numeral 8 is an exposure chamber. Numeral 1 is a Be port, and 9 is an exhaust port. The exposure chamber 8 is shut out from an X-ray generation source by Be, and in the chamber, exposure can be achieved in any state such as an atmosphere of air, vacuum or He. Reference numeral 2 is a mask stage, numeral 3 is an alignment detecting portion, 4 is an X-ray mask structure, 5 is a wafer (a semiconductor substrate) which is a member to be exposed, 6 is a wafer chuck, and 7 is a wafer stage.

The X-ray mask structure 4 is mechanically set in an approximately predetermined direction by the use of an alignment pin, an orientation flat or the like, and then adsorbed by the mask stage 2. The wafer 5 is similarly set on the wafer chuck 6, and a relative positional relation between the X-ray mask structure 4 and the wafer 5 is determined in accordance with an indication from the alignment detecting portion 3. Afterward, the wafer 5 is exposed to X rays.

Next, reference will be made to a manufacturing method of the X-ray mask structure of the present invention. The method for manufacturing the X-ray mask structure of The present invention is characterized in that after the formation of an X-ray absorber pattern, the portion of the X-ray permeable film having no X-ray absorber pattern thereon is oxidized. Another method for manufacturing the X-ray mask structure of the present invention is characterized by including:

(a) a process for forming a metal film on the X-ray permeable film,
(b) a process for forming an X-ray absorber pattern on the metal film, and
(c) a process in which after the formation of the X-ray absorber pattern, the portion of the metal film having no X-ray absorber pattern thereon is oxidized.

As an oxidation treatment process which is used in the present invention, there can be preferably used any one of an oxygen plasma treatment, an oxygen ion injection treatment and a heat treatment in an oxygen atmosphere.

Furthermore, as a metal thin film formed between the X-ray permeable film and a metal which plays the main role as the X-ray absorber on the X-ray permeable film, any kind of metal can be used irrespective of its application, so long as its metal oxide in the state of the thin film obtained by the above-mentioned oxidation treatment has the high permeability of visible light or infrared rays for use in alignment.

The thickness of the metal thin film is preferably from 8 Å to 1000 Å, more preferably 20 Å to 800 Å so as to inhibit the noticeable deterioration of the X-ray permeability, depending upon an application. Since this kind of metal thin film has little influence on the X-ray permeability, there is no problem, even if it remains. Moreover, if the metal thin film is oxidized, the deterioration of the alignment light permeability can be prevented. Thus, even if the metal thin film is not peeled off and so it remains in the X-ray mask structure, there is not a conventional problem that the alignment light permeability deteriorates on the portion having no pattern thereon.

The material of the above-mentioned metal thin film is preferably a metal having an atomic number of 35 or less, and the metal thin film made of such a metal material has a low X-ray absorbency on the whole and therefore it scarcely affects the X-ray permeability. In order not to lower the alignment light permeability, the metal thin film is oxidized without peeling. When a Cr film having a thickness of 50 Å is oxidized with oxygen plasma, the permeability deteriorates merely slightly, depending upon the selected alignment light. In the case of an He-Ne laser (6328 Å), it deteriorates as much as 1.5%, and in the case of a semiconductor laser (8300 Å), it deteriorates as much as 0.5% as compared with a substrate having a thickness of 2 μm and comprising SiN only. Thus, the metal thin film can be made of any metal, so long as it is selected from the metals having atomic numbers of 35 or less in compliance with an application. However, the preferable metal oxide, when being in a thin film state, has the high permeability of the visible light or the infrared rays used in the alignment. Particularly preferable examples of the metal for the metal thin film include chromium, titanium, aluminum, zinc, copper or nickel. The thickness of the metal thin film is 1,000 Å or less, preferably 100 Å or less so as to inhibit the noticeable deterioration of the X-ray permeability, depending upon its application.

In the method for manufacturing the X-ray mask structure of the present invention, the above-mentioned oxidation treatment is carried out at least in the vicinity of the alignment mark.

Furthermore, in the method for manufacturing the X-ray mask structure of the present invention, an oxidation treatment process of the X-ray absorber may be contained for the purpose of providing oxidation barrier layers for the X-ray absorber.

As the material of the X-ray absorber, there can be used a metal having an atomic number of 70 or more which possesses a large X-ray absorbency. Preferable examples of the metal include tantalum, tungsten, gold and platinum. These metals are scarcely oxidized, but if treated with high energy, they can be oxidized on the surfaces thereof. It has been confirmed by an ESCA measurement that even gold which is a noble metal can be oxidized. Prior to the oxidation treatment, a position strain quantity of the pattern is measured, and the oxidation is carried out simultaneously with the above-mentioned oxidation treatment to minimize the position strain quantity.

EXAMPLES

Next, the present invention will be described in more detail with reference to examples shown in drawings.

Example 1

FIGS. 3A to 3F illustrate as sectional views the first example of an X-ray mask structure manufacturing process according to the present invention.

As a material of a substrate 11 which will be a supporting frame, an Si wafer is often used, and in this example, an Si wafer having a diameter of 3 inches and a thickness of 2 mm was used. This substrate was set on a plasma CVD equipment. In the first step, back pressure was reduced to $2 \times 10^{-6}$ Torr, and 5 sccm of a 10% silane gas diluted with hydrogen and 20 sccm of an ammonia gas were fed through a hole perforated in a lower electrode. The substrate 11 was heated up to a temperature of 250° C. and a high-frequency power of 20 W was then applied under a pressure of $5 \times 10^{-3}$ Torr to form an X-ray permeable film 12 of silicon nitride having a thickness of 2 μm.

Figure 3A:
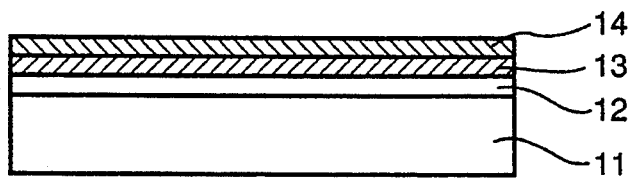
FIGS. 3A to 3F illustrate a first example of an X-ray mask structure manufacturing process of the present invention.

A gold film having a thickness of 500 Å which would be a plating electrode 14 for the formation of an X-ray absorber, and a chromium film having a thickness of 50 Å as a metal thin film 13 for adhesion were continuously deposited by an EB vapor deposition, as shown in FIG. 3A. A material of the metal thin film 13 is a metal capable of improving adhesive strength such as Ti, Al, Sn or Zn.

Figure 3B:
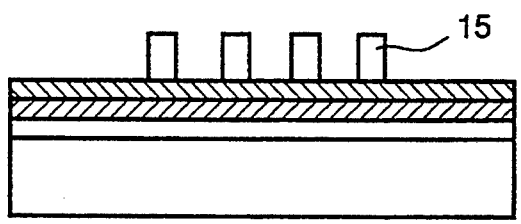

An electron ray resist PMMA (trade name OEBR-1000, made by Tokyo Oka Kogyo Co., Ltd.) was applied thereonto, and a desired fine resist pattern 15 was then formed by means of an electron ray depictor, as shown in FIG. 3B.

Figure 3C:
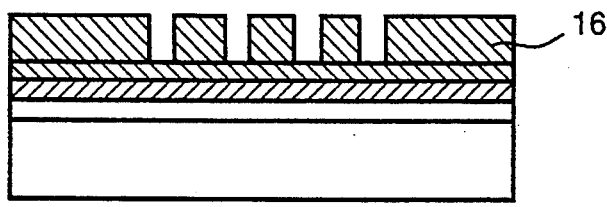

Next, plating was carried out at 50° C. at a current density of 1 mA/cm$^2$ by the use of a gold sulfite plating solution (trade name Neutronex 309, made by EEJA) to form a gold film which would be an X-ray absorber 16. Afterward, the resist pattern 15 was peeled off with an exclusive peeling solution, as shown in FIG. 3C.

The portion of the plating electrode 14 having no X-ray absorber 16 thereon was peeled off by means of an RIE equipment.

Back pressure was reduced to $1 \times 10^{-5}$ Torr, and 20 sccm of an argon gas was fed and 200 W was then applied under $5 \times 10^{-2}$ Torr to carry out etching. Since the plating electrode 14 and the X-ray absorber were both made of gold, they were equally etched, so that the X-ray absorber took a conformation denoted by 16' in FIG. 3D.

Figure 3D:
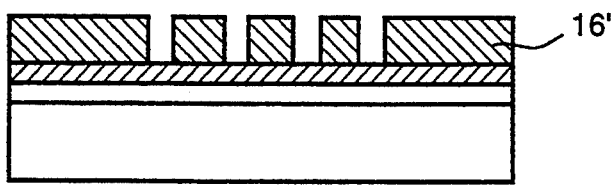
Figure 3E:
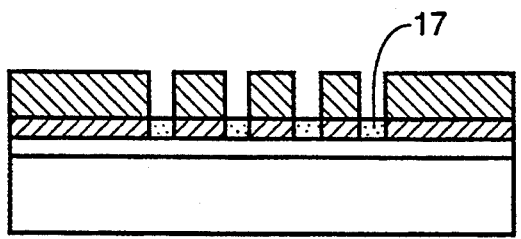

Furthermore, 20 sccm of an oxygen gas was fed to the same RIE equipment and 130 W was then applied under $5 \times 10^{-2}$ Torr, so that the portion of the metal thin film 13 having no pattern thereon was converted into chromium oxide 17 with oxygen plasma, as shown in FIG. 3E.

Figure 3F:
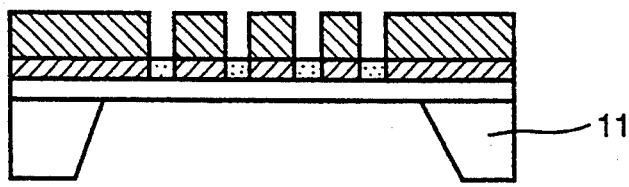

In the last step, the back of the Si wafer was etched at 110° C. with a 30% by weight aqueous potassium hydroxide solution to form a supporting frame 11, as shown in FIG. 3F.

Figure 4:
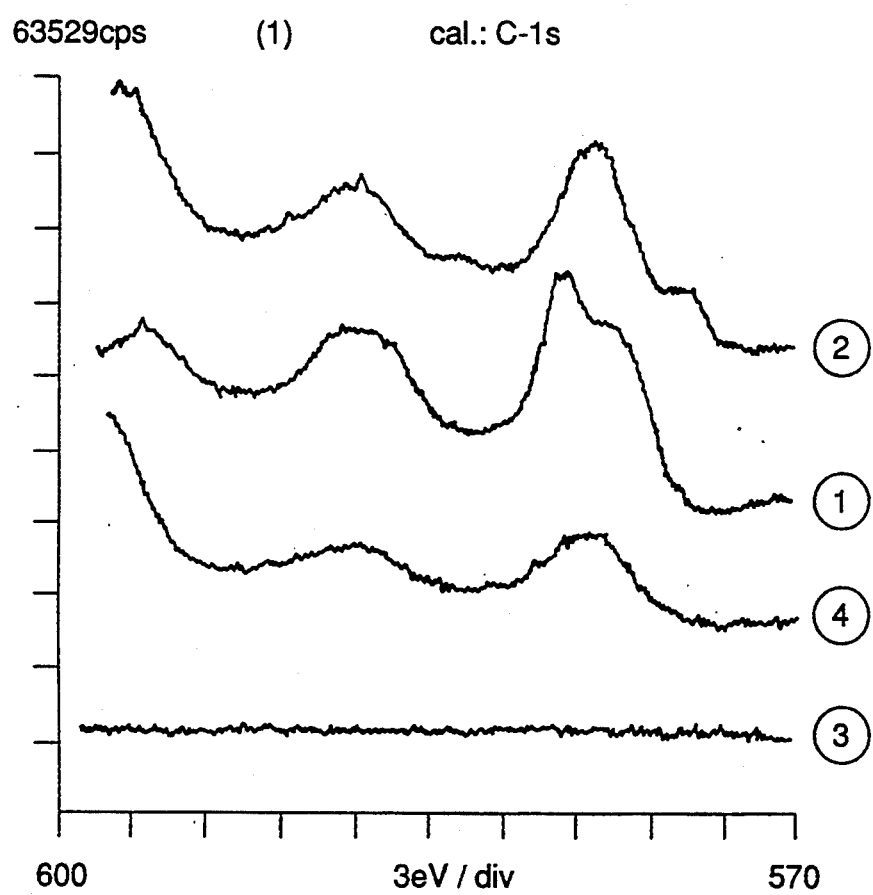
FIG. 4 shows partial charts of ESCA analysis of the surface of four thin films.

In order to confirm that the film obtained by oxidizing the metal thin film 13 in FIG. 3E in such a manufacturing process was chromium oxide, the surface of the oxidized film was analyzed by ESCA. For the following four kinds of films in addition to a sample for comparison, the analysis was carried out. FIG. 4 shows partial charts containing peaks of Cr.

(1) The film 17 in FIG. 3E obtained by oxidizing the metal thin film 13.

(2) The metal thin film 13 in FIG. 3D (after the portion of the plating electrode 14 having no pattern thereon was peeled off).

(3) The untreated silicon nitride film 12.

(4) The silicon nitride film in FIG. 3E after the metal thin film 13 was peeled off.

From the observation of FIG. 4, it is apparent that Cr was not present in the film (3). In the film (4), there was a small peak at the same position as in the film (2), and therefore it seemed that Cr remained. In fact, the measurement was made after the film was exposed to air, and thus Cr on the outermost surface was slightly oxidized. In the case of the film (1), a peak shifted toward the side of higher energy, which indicated that chromium was further oxidized, as compared with these two films (3) and (4). The films (1) and (4) had about the same values of light permeability, but according to the values measured by ESCA, the film (4) only had the same Si peak as in the film (3). Thus, it was confirmed from the foregoing that in the film (1), chromium oxide was still present in contrast to the film (4) from which the metal thin film 13 was peeled off.

As described above, chromium of the thin film for adhesion was oxidized without etching, and thus, there could be prevented the thickness decrease of the gold thin film which was the X-ray absorber 16' and the generation of the film thickness non-uniformity of silicon nitride constituting the X-ray permeable film. Furthermore, owing to the presence of chromium oxide 17 in the portion having no pattern thereon, the deterioration of the permeability was inhibited. That is, in the case of X-rays, the deterioration of the permeability was only 0.6% and in the case of an He-Ne laser (6328 Å) for use in alignment, that of the permeability was 1.5%, and so there was no problem.

Example 2

FIGS. 5A to 5E illustrate as sectional views the second example of an X-ray mask structure manufacturing process according to the present invention.

As a material of a substrate 31 which will be a supporting frame, an Si wafer is often used, and in this example, an Si wafer having a diameter of 3 inches and a thickness of 1 mm was used. This substrate was set on a plasma CVD equipment. In the first step, back pressure was reduced to $1 \times 10^{-6}$ Torr, and 10 sccm of a 10% silane gas diluted with hydrogen and 10 sccm of a methane gas were fed through a hole perforated in a lower electrode. The substrate 31 was heated up to a temperature of 650° C. and a high-frequency power of 50 W was then applied under a pressure of $5 \times 10^{-3}$ Torr to form an X-ray permeable film 32 of silicon carbide having a thickness of 2 μm.

Figure 5A:
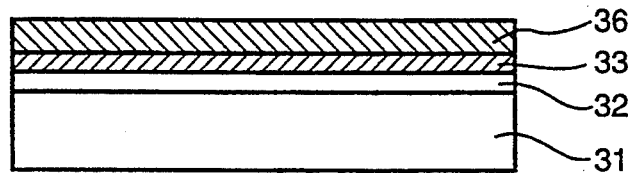
FIGS. 5A to 5E Illustrate a second example of an X-ray mask structure manufacturing process of the present invention.

Afterward, the film was set on a two-dimensional sputtering equipment, and after back pressure was reduced to $2 \times 10^{-6}$ Torr, 10 sccm of an argon gas was fed thereto and a high frequency power of 100 W was then applied at a substrate temperature of 150° C. under a pressure of $10 \times 10^{-2}$ Torr to form a chromium film having a thickness of 200 Å which would be a metal thin film 33 for an absorber etching stopper. Furthermore, 500 W was continuously applied, thereby forming a W film of 8000 Å in thickness which would be an X-ray absorber 36, as shown in FIG. 5A.

As a material of the metal thin film, any metal can be used, so long as it is such as to have some difference of an etching grade as compared with a metal for the X-ray absorber.

Figure 5B:
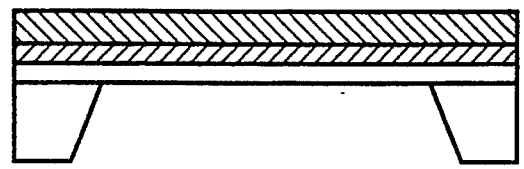

The back of the Si wafer was etched at 110° C. with a 30% by weight aqueous potassium hydroxide solution to form a supporting frame 81, as shown in FIG. 5B.

Figure 5C:
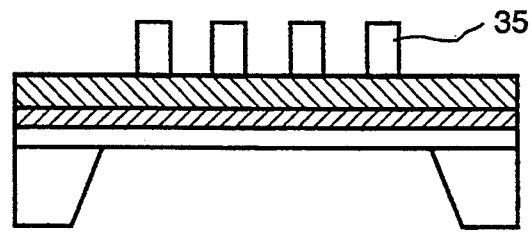

PIQ (trade name, made by Hitachi Chemical Co., Ltd.) which would be a lower resist layer and SNR (trade name, made by Toyo Soda Mfg. Co., Ltd.) which would be an upper resist layer containing Si were applied thereonto, and a desired fine resist pattern 35 was then formed by an electron ray depictor and an RIE equipment, as shown in FIG. 5C.

Figure 5D:
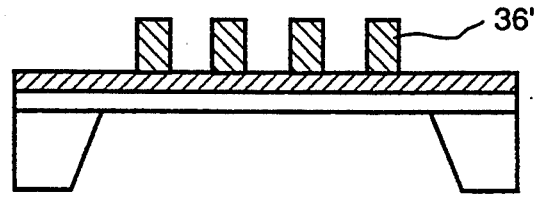

Next, W which would be an X-ray absorber 36 was etched by means of an RIE equipment. After back pressure was reduced to $1 \times 10^{-5}$ Torr, 50 sccm of a $CF_4$ gas was fed and 200 W was then applied under $5 \times 10^{-2}$ Torr to etch W. Since scarcely being etched with the $CF_4$ gas, chromium was not damaged, so that the X-ray absorber took a conformation represented by 36', as shown in FIG. 5D. The resist pattern 35 was etched simultaneously with the etching of W, but its remaining portion was peeled off with an exclusive peeling solution.

Figure 5E:
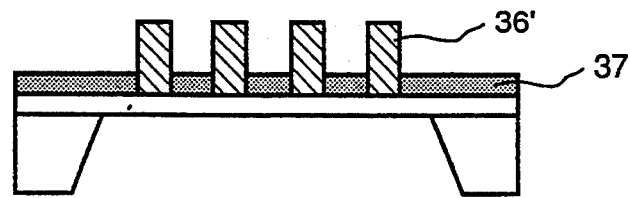

Afterward, in an ion injector, oxygen ions were injected at an oxygen ion concentration of $10^{16}$–$10^{17}$ ions/cm$^2$ at 10–20 KV to convert the portion of the metal thin film 33 having no pattern thereon into chromium oxide 37, as shown in FIG. 5E. When the ion injection is used at the suitably selected ion concentration and accelerating voltage, even the relatively thick film can be oxidized. Therefore, the metal thin film may be formed so that chromium oxide may have such a thickness as to become a reflection preventing film (630 Å in the case of an He-Ne laser).

As described above, the metal thin film of chromium which was an etching stopper was oxidized without peeling, and thus, there could be prevented the generation of the film thickness non-uniformity of silicon carbide constituting the X-ray permeable film. Furthermore, owing to the presence of chromium oxide 37 in the portion having no pattern thereon, the deterioration of the permeability was inhibited. That is, in the case of X-rays, the deterioration of the permeability was only 2.3% and in the case of an He-Ne laser (6328 Å) for use in alignment, that of the permeability was 5.0%, and so there was no problem.

Example 3

FIGS. 6A to 6F illustrate as sectional views the third example of an X-ray mask structure manufacturing process according to the present invention.

As a material of a substrate 41 which will be a supporting frame, an Si wafer is often used, and in this example, an Si wafer having a diameter of 3 inches and a thickness of 2 mm was used. This substrate was set on a plasma CVD equipment. In the first step, back pressure was reduced to $2 \times 10^{-6}$ Torr, and 5 sccm of a 10% silane gas diluted with hydrogen and 20 sccm of an ammonia gas were fed through a hole perforated in a lower electrode. The substrate 41 was heated up to a temperature of 250° C. and a high-frequency power of 20 W was then applied under a pressure of $5 \times 10^{-3}$ Torr to form an X-ray permeable film 42 of silicon nitride having a thickness of 2 μm.

Figure 6A:
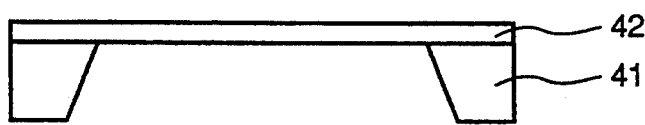
FIGS. 6A to 6F illustrate a third example of an X-ray mask structure manufacturing process of the present invention.

Next, the back of the Si wafer was etched at 110° C. with a 30% by weight aqueous potassium hydroxide solution to form a supporting frame 41, as shown in FIG. 6A.

Figure 6B:
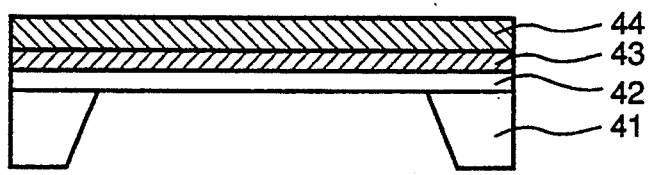

A gold film having a thickness of 500 Å which would be a plating electrode 44 for the formation of an X-ray absorber, and a titanium film having a thickness of 50 Å as a metal thin film 43 for adhesion were continuously deposited by an EB vapor deposition, as shown in FIG. 6B.

Figure 6C:
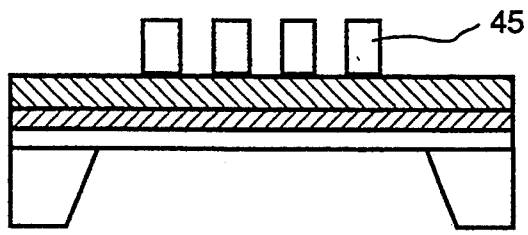

An electron ray resist PMMA (trade name OEBR-1000, made by Tokyo Oka Kogyo Co., Ltd.) was applied thereonto, and a desired fine resist pattern 45 was then formed by means of an electron ray depictor, as shown in FIG. 6C.

Figure 6D:
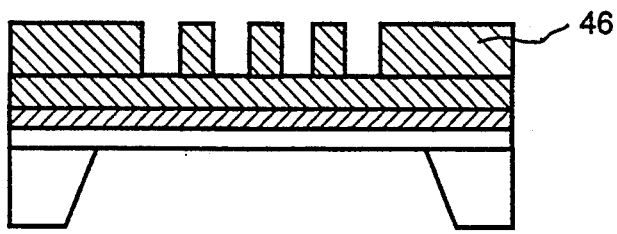
Figure 6E:
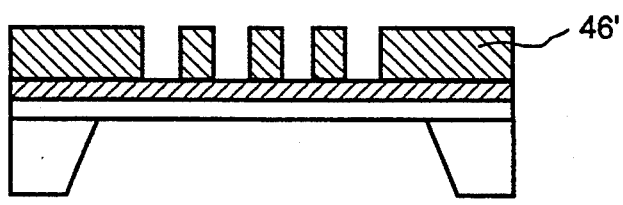

Next, plating was carried out at 50° C. at a current density of 0.5 mA/cm$^2$ by the use of a gold sulfite plating solution (trade name Neutronex 309, made by EEJA) to form a gold film which would be an X-ray absorber 46. Afterward, the resist pattern 45 was peeled off with an exclusive peeling solution, as shown in FIG. 6D.

The portion of the plating electrode 44 having no X-ray absorber 46 thereon was peeled off by means of an RIE equipment.

Back pressure was reduced to $1 \times 10^{-5}$ Torr, and 20 sccm of an argon gas was fed and 200 W was then applied under $5 \times 10^{-2}$ Torr to carry out etching. Since the plating electrode 44 and the X-ray absorber were both made of gold, they were equally etched, so that the X-ray absorber took a conformation denoted by 46' in FIG. 6E.

Figure 6F:
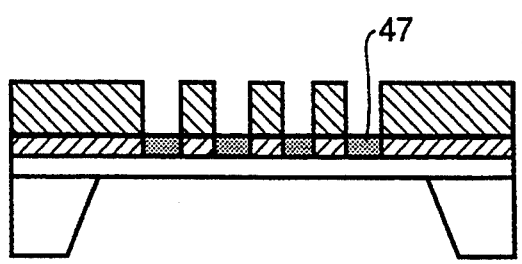

Next, a heat treatment was carried out at 100° C. in an oxygen atmosphere to convert the portion of the metal thin film 43 having no pattern thereon into titanium oxide 47, as shown in FIG. 6F.

As described above, titanium of the metal thin film for adhesion was oxidized without peeling, and thus, there could be prevented the thickness reduction of the gold film which was the X-ray absorber 46' and the generation of the film thickness non-uniformity of silicon nitride constituting the X-ray permeable film. Furthermore, owing to the presence of titanium oxide 47 in the portion having no pattern thereon, the deterioration of permeability was inhibited. That is, in the case of X-rays, the deterioration of the permeability was only 0.3% and in the case of an He-Ne laser (6328 Å) for use in alignment, that of the permeability was 1.0%, and so there was no problem.

Example 4

FIGS. 7A to 7E illustrate as sectional views the fourth example of an X-ray mask structure manufacturing process according to the present invention.

As a material of a substrate 61 which would be a supporting frame, an Si wafer was used. A silicon nitride film having a thickness of 2 μm was formed in the same manner as in Example 3 to obtain an X-ray permeable film 62.

Figure 7A:
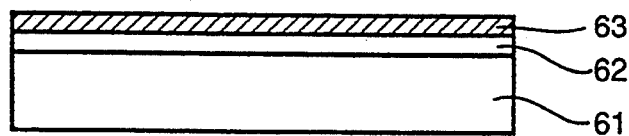
FIGS. 7A to 7E illustrate a fourth example of an X-ray mask structure manufacturing process of the present invention.

A nickel film having a thickness of 200 Å as a metal thin film 63 which would be a plating electrode for the formation of an X-ray absorber was deposited by an EB deposition, as shown in FIG. 7A.

Figure 7B:
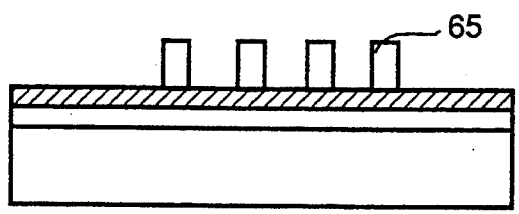

An electron rays resist PMMA (trade name OEBR-1000, made by Tokyo Oka Kogyo Co., Ltd.) was applied thereonto, and a desired fine resist pattern 65 was then formed by means of an electron ray depictor, as shown in FIG. 7B.

Figure 7C:
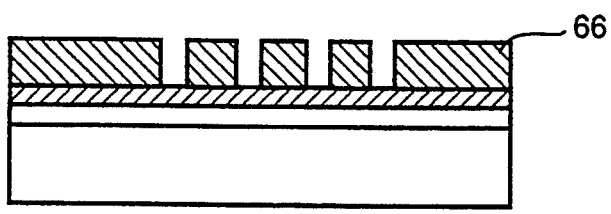

Next, plating was carried out at 50° C. at a current density of 0.5 mA/cm$^2$ by the use of a gold sulfite plating solution (trade name Neutronex 309, made by EEJA) to form a gold film which would be an X-ray absorber 66. Afterward, the resist pattern 65 was peeled off with an exclusive peeling solution, as shown in FIG. 7C.

Figure 7D:
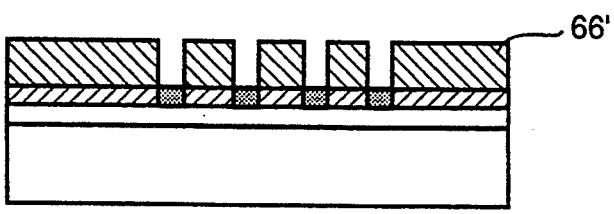
Figure 7E:
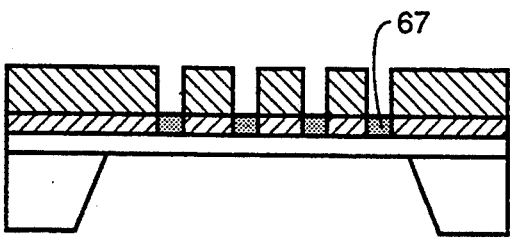

Afterward, in an ion injector, oxygen ions were injected at all oxygen ion concentration of $10^{16}$–$10^{17}$ ions/cm$^2$ at 10–20 KV to convert the portion of the metal thin film 63 having no pattern thereon into nickel oxide 67, as shown in FIG. 7D.

As described above, the nickel film which was the metal thin film for adhesion was oxidized without peeling, and thus, there could be prevented the thickness reduction of the gold film which was the X-ray absorber 66' and the generation of the film thickness non-uniformity of silicon nitride constituting the X-ray permeable film. Furthermore, owing to the presence of titanium oxide 67 in the portion having no pattern thereon, the deterioration of permeability was inhibited. That is, In the case of X-rays, the deterioration of the permeability was only 4.2% and in the case of an He-Ne laser (6328 Å) for use in alignment, that of the permeability was 5.0%, and so there was no problem.

In addition, when exposed to the X rays, the thickness reduction of the X-ray absorber was slight, so that a sufficient contrast could be obtained, and thus a high precise semiconductor chip could be prepared.

Example 5

FIGS. 8A to 8F illustrate as sectional views the fifth example of an X-ray mask structure manufacturing process according to the present invention.

As a material of a substrate 51 which will be a supporting frame, an Si wafer is often used, and in this example, an Si wafer having a diameter of 3 inches and a thickness of 2 mm was used. This substrate was set on a plasma CVD equipment.

In the first place, back pressure was reduced to $2 \times 10^{-6}$ Torr, and 5 sccm of a 10% silane gas diluted with hydrogen and 20 sccm of an ammonia gas were fed through a hole perforated in a lower electrode. The substrate 51 was heated up to a temperature of 250° C. and a high-frequency power of 20 W was then applied under a pressure of $5 \times 10^{-3}$ Torr to form an X-ray permeable film 52 of silicon nitride having a thickness of 2 μm.

Figure 8A:
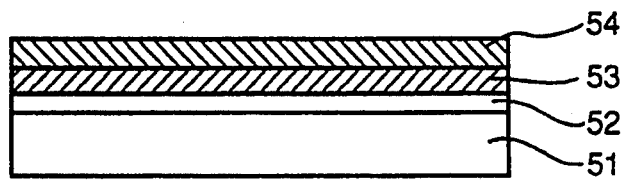
FIGS. 8A to 8F illustrate a fifth example of an X-ray mask structure process of the present invention.

A gold film having a thickness of 500 Å which would be a plating electrode 54 for the formation of an X-ray absorber, and a chromium film having a thickness of 50 Å as a metal thin film 53 for adhesion were continuously deposited by an EB vapor deposition, as shown in FIG. 8A. A material of the metal thin film 53 is a metal capable of improving adhesive strength such as Ti, Al or Zn.

Figure 8B:
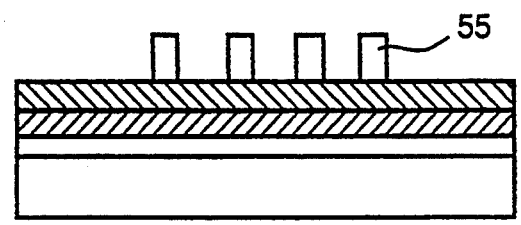

An electron rays resist PMMA (trade name OEBR1000, made by Tokyo Oka Kogyo Co., Ltd.) was applied thereonto, and a desired fine resist pattern 55 was then formed by means of an electron ray depictor, as shown in FIG. 8B.

Figure 8C:
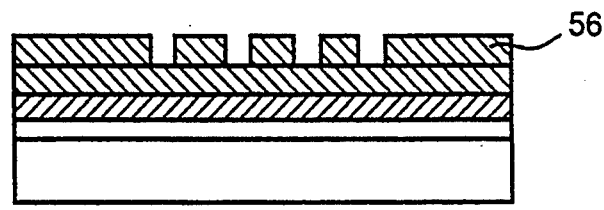
Figure 8D:
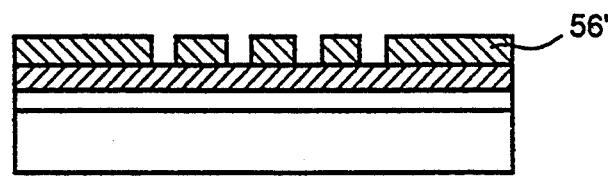

Next, plating was carried out at 50° C. at a current density of 1 mA/cm$^2$ by the use of a gold sulfite plating solution (trade name Neutronex 309, made by EEJA) to form a gold film which would be an X-ray absorber 56. Afterward, the resist pattern 55 was peeled off with an exclusive peeling solution, as shown in FIG. 8C. The portion of the plating electrode 54 having no X-ray absorber 56 thereon was peeled off by means of an RIE equipment. Back pressure was reduced to $1 \times 10^{-5}$ Torr, and 20 sccm of an argon gas was fed and 200 W was then applied under $5 \times 10^{-2}$ Torr to carry out etching. Since the plating electrode 54 and the X-ray absorber were both made of gold, they were equally etched, so that the X-ray absorber took a conformation denoted by 56' in FIG. 8D.

Figure 8E:
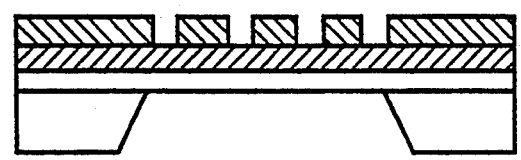

Furthermore, the back of the Si wafer was etched at 110° with a 30% by weight potassium hydroxide solution to form a supporting frame 51, as shown in FIG. 8E. At this time, a pattern position strain quantity of the X-ray absorber 56' was measured by means of a light wave interference system coordinate measuring equipment, and it was 0.3 μm. Oxidizing conditions were selected taking this strain quantity into consideration.

Figure 8F:
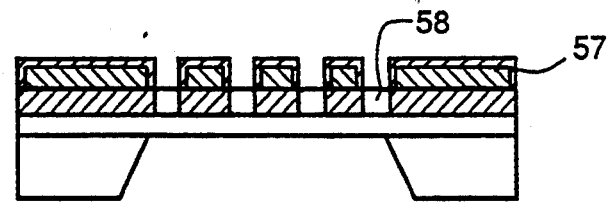

In the last step, 20 sccm of an oxygen gas was fed to the same RIE equipment, and 200 W was then applied under $5 \times 10^{-2}$ Torr, so that by oxygen plasma, the surface portion of the X-ray absorber 56' was converted into gold oxide 57 and the portion of the metal thin film 53 having no pattern thereon was converted into chromium oxide 58, as shown in FIG. 8F. It is difficult to oxidize gold, but when large energy is applied, the uppermost surface can be only oxidized.

As understood from the above, when chromium of the thin film for adhesion was oxidized without etching, there could be prevented the thickness decrease of the gold thin film which was the X-ray absorber 56' and the generation of the film thickness non-uniformity of silicon nitride constituting the X-ray permeable film. Furthermore, owing to the presence of chromium oxide 58 in the portion having no pattern thereon, the deterioration of permeability was inhibited. That is, in the case of X-rays, the deterioration of the permeability was only 0.6% and in the case of an He-Ne laser (6328 Å) for use in alignment, that of the permeability was 1.5%, and so there was no problem. In addition, when the position strain quantity of the X-ray absorber 56' was measured again by means of the light wave interference system coordinate measuring equipment, it decreased to 0.03 $\mu$m (the limit of measurement). Thus, the product can be used as a highly precise X-ray mask structure.

Example 6

FIGS. 9A to 9E illustrate as sectional views the sixth example of an X-ray mask structure manufacturing process according to the present invention.

As a material of a substrate 71 which will be a supporting frame, an Si wafer is often used, and in this example, an Si wafer having a diameter of 3 inches and a thickness of 1 mm was used. This substrate was set on a plasma CVD equipment. In the first step, back pressure was reduced to $1 \times 10^{-6}$ Torr, and 10 sccm of a 10% silane gas diluted with hydrogen and 10 sccm of a methane gas were fed through a hole perforated in a lower electrode. The substrate 71 was heated up to a temperature of 650° C. and a high-frequency power of 50 W was then applied under a pressure of $5 \times 10^{-3}$ Torr to form an X-ray permeable film 72 of silicon carbide having a thickness of 2 $\mu$m.

Figure 9A:
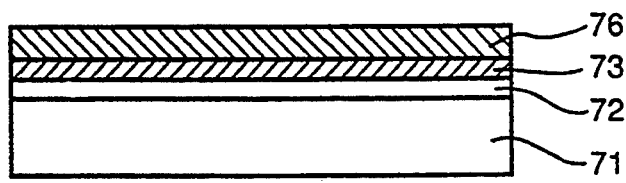
FIGS. 9A to 9E illustrate a sixth example of an X-ray mask structure manufacturing process of the present invention.

Afterward, the film was set on a two-dimensional sputtering equipment, and after back pressure was reduced to $2 \times 10^{-6}$ Torr, 10 sccm of an argon gas was fed thereto and a high frequency power of 100 W was then applied at a substrate temperature of 150° C. under a pressure of $10 \times 10^{-2}$ Torr to form a chromium film having a thickness of 200 Å which would be a metal thin film 73 for an absorber etching stopper. Furthermore, 500 W was continuously applied, thereby forming a W film of 8000 Å in thickness which would be an X-ray absorber 76, as shown in FIG. 9A. As a material of the metal thin film 73, any metal can be used, so long as it Is such as to have some difference of an etching grade as compared with a metal for the X-ray absorber.

Figure 9B:
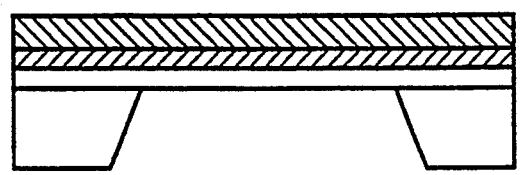
Figure 9C:
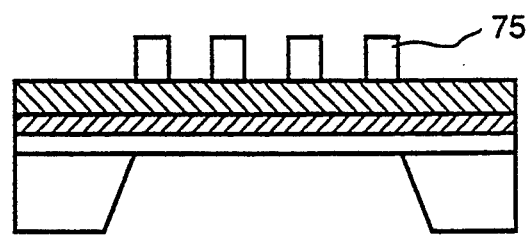

The back of the Si wafer was etched at 110° C. with a 30% by weight aqueous potassium hydroxide solution to form a supporting frame 21, as shown in FIG. 9B. PIQ (trade name, made by Hitachi Chemical Co., Ltd.) which would be a lower resist layer and SNR (trade name, made by Toyo Soda Mfg. Co., Ltd.) which would be an upper resist layer containing Si were applied thereonto, and a desired fine resist pattern 75 was then formed by an electron ray depictor, as shown in FIG. 9C.

Next, W which would be an X-ray absorber 76 was etched by means of an RIE equipment. After back pressure was reduced to $1 \times 10^{-5}$ Torr, 50 sccm of a CF$_4$ gas was fed and 200 W was then applied under $5 \times 10^{-2}$ Torr to etch W.

Figure 9D:
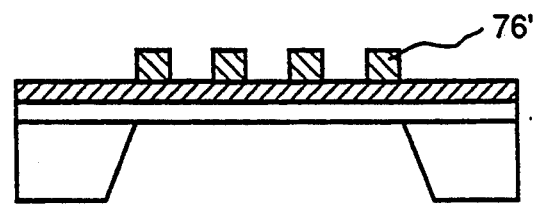

Since scarcely being etched with the CF$_4$ gas, chromium was not damaged, so that the X-ray absorber took a conformation represented by 76', as shown in FIG. 9D. The resist pattern 75 was etched simultaneously with the etching of W, but its remaining portion was peeled off with an exclusive peeling solution. At this time, a pattern position strain quantity of the X-ray absorber 76' was measured by means of a light wave interference system coordinate measuring equipment, and it was 0.5 $\mu$m. Oxidizing conditions were selected taking this strain quantity into consideration.

Figure 9E:
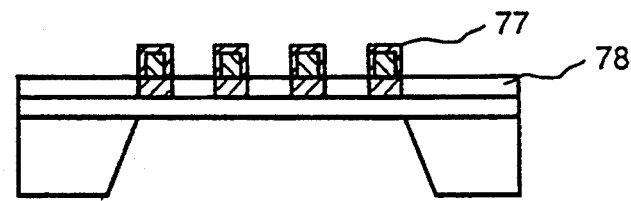

20 sccm of an oxygen gas was fed to the same RIE equipment, and 130 W was then applied under $5 \times 10^{-2}$ Torr, so that by oxygen plasma, the surface portion of the X-ray absorber 76' was converted into tungsten oxide 77 and the portion of the metal thin film 73 having no pattern thereon was converted into chromium oxide 78, as shown in FIG. 9E.

As described above, when the metal thin film of chromium which was an etching stopper was oxidized without peeling, there could be prevented the generation of the film thickness non-uniformity of silicon nitride constituting the X-ray permeable film. Furthermore, owing to the presence of chromium oxide 77 in the portion having no pattern thereon, the deterioration of permeability was inhibited. That is, in the case of X-rays, the deterioration of the permeability was only 2.3% and in the case of an He-Ne laser (6328 Å) for use in alignment, that of the permeability was 5.0%, and so there was no problem. In addition, when the position strain quantity of the X-ray absorber 76' was measured again by means of the light wave interference system coordinate measuring equipment, it decreased to 0.05 $\mu$m. Thus, the product can be used as a highly precise X-ray mask structure.

Example 7

FIGS. 10A to 10E illustrate as sectional views the seventh example of an X-ray mask structure manufacturing process according to the present invention.

Figure 10A:
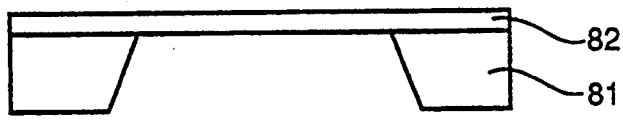
FIGS. 10A to 10E illustrate a seventh example of an X-ray mask structure manufacturing process of the present invention.

As a material of a substrate 81 which will be a supporting frame, an Si wafer is often used, and in this example, an Si wafer having a diameter of 3 inches and a thickness of 2 mm was used. This substrate was set on a plasma CVD equipment. In the first step, back pressure was reduced to $2 \times 10^{-6}$ Torr, and 5 sccm of a 10% silane gas diluted with hydrogen and 20 sccm of an ammonia gas were fed through a hole perforated in a lower electrode. The substrate 81 was heated up to a temperature of 250° C. and a high-frequency power of 20 W was then applied under a pressure of $5 \times 10^{-3}$ Torr to form an X-ray permeable film 82 of silicon nitride having a thickness of 2 $\mu$m. Next, the back of the Si wafer was etched at 110° C. with a 30% by weight aqueous potassium hydroxide solution to form a supporting frame 81, as shown in FIG. 10A.

Figure 10B:
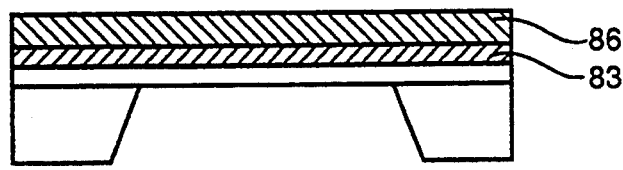

Afterward, the film was set on a two-dimensional sputtering equipment, and after back pressure was reduced to $2 \times 10^{-6}$ Torr, 10 sccm of an argon gas was fed thereto and a high frequency power of 100 W was then applied at a substrate temperature of 150° C. under a pressure of $10 \times 10^{-2}$ Torr to form a chromium film having a thickness of 100 Å which would be a metal thin film 83 for an absorber etching stopper. Furthermore, 500 W was continuously applied, thereby forming a W film of 8000 Å in thickness which would be an X-ray absorber 86, as shown in FIG. 10B. As a material of the metal thin film 83, any metal can be used, so long as it is such as to have some difference of an etching grade as compared with a metal for the X-ray absorber.

Figure 10C:
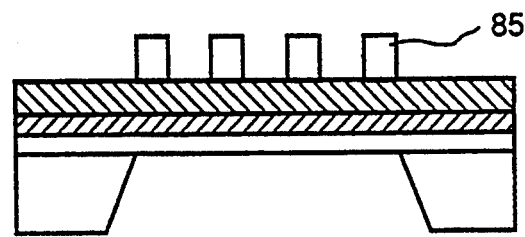

An electron ray resist PMMA (trade name OEBR-1000, made by Tokyo Oka Kogyo Co., Ltd.) was applied thereonto, and a desired fine resist pattern 85 was then formed by means of an electron ray depictor, as shown in FIG. 10C.

Figure 10D:
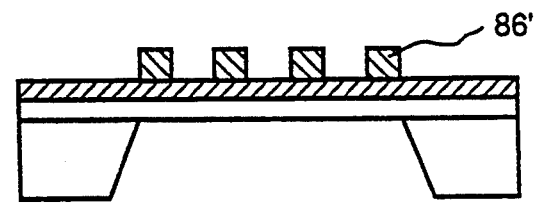

Next, W which would be the X-ray absorber 86 was etched by means of an RIE equipment. After back pressure was reduced to $1 \times 10^{-5}$ Torr, 50 sccm of a $CF_4$ gas was fed and 200 W was then applied under $5 \times 10^{-2}$ Torr to etch W. Since scarcely being etched with the $CF_4$ gas, chromium was not damaged, so that the X ray-absorber took a conformation represented by 86', as shown in FIG. 10D. The resist pattern 85 was etched simultaneously with the etching of W, but its remaining portion was peeled off with an exclusive peeling solution.

Figure 10E:
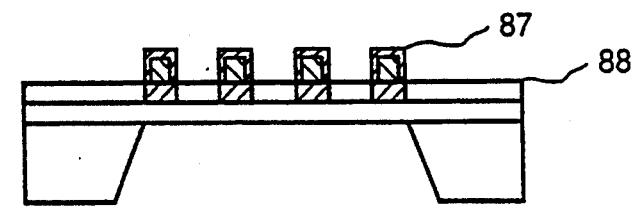

At this time, a pattern position strain quantity of the X-ray absorber 86' was measured by means of a light wave interference system coordinate measuring equipment, and it was 0.3 μm. Oxidizing conditions were selected taking this strain quantity into consideration. Next, a heat treatment was carried out at 100° C. in an oxygen atmosphere, whereby the outermost surface of the absorber 86' was converted into tungsten oxide 87 and the portion of the metal thin film 83 having no pattern thereon was converted into chromium oxide 88, as shown in FIG. 10E. As understood from the above, chromium constituting the thin film for adhesion was oxidized without peeling, and thus, there could be prevented the thickness reduction of gold constituting the X-ray absorber 86' and the generation of the film thickness non-uniformity of silicon nitride constituting the X-ray permeable film.

Furthermore, owing to the presence of chromium oxide 88 in The portion having no pattern thereon, the deterioration of permeability was inhibited. That is, in the case of X-rays, the deterioration of the permeability was only 0.3% and in the case of an He-Ne laser (6328 Å) for use in alignment, that of the permeability was 1.0%, and so there was no problem. In addition, when the position strain quantity of the X-ray absorber 86' was measured again by means of the light wave interference system coordinate measuring equipment, it decreased to 0.05 μm. Thus, the product can be used as a highly precise X-ray mask structure.

Example 8

FIGS. 11A to 11E illustrate as sectional views the eighth example of an X-ray mask structure manufacturing process according to the present invention.

As a material of a substrate 91 which would be a supporting frame, an Si wafer was used, and a silicon nitride film having a thickness of 2 μm was formed as an X-ray permeable film 92 in the same manner as in Example 7.

Figure 11A:
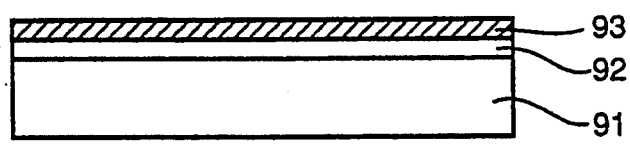
FIGS. 11A to 11E illustrate an eighth example of an X-ray mask structure manufacturing process of the present invention.
Figure 11B:
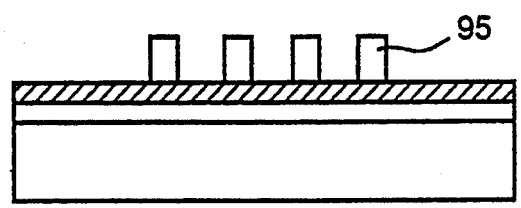

A nickel film having a thickness of 200 Å as a metal thin film 93 which would be a plating electrode for the formation of an X-ray absorber was deposited by an EB vapor deposition, as shown in FIG. 11A. An electron rays resist PMMA (trade name OEBR-1000, made by Tokyo Oka Kogyo Co., Ltd.) was applied thereonto, and a desired fine resist pattern 95 was then formed by means of an electron ray depictor, as shown in FIG. 11B.

Figure 11C:
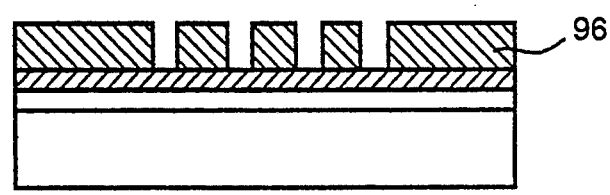
Figure 11D:
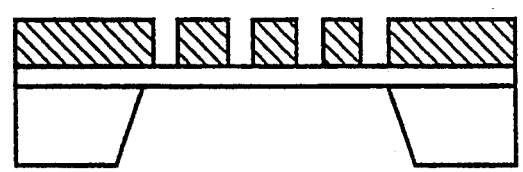
Figure 11E:
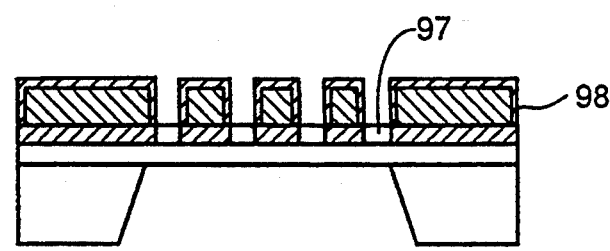

Next, plating was carried out at 50° C. at a current density of 0.5 mA/cm² by the use of a gold sulfite plating solution (trade name Neutronex 309, made by EEJA) to form a gold film which would be an X-ray absorber 96. Afterward, the resist pattern 95 was peeled off with an exclusive peeling solution, as shown in FIG. 11C. Afterward, the back of the Si wafer was etched at 110° C. with a 30% by weight aqueous potassium hydroxide solution to form a supporting frame 91, as shown in FIG. 11D. At this time, a pattern position strain quantity of the X-ray absorber 96 was measured by means of a light wave interference system coordinate measuring equipment, and the measured maximum strain quantity was 0.2 μm. Oxidizing conditions were selected taking this strain quantity into consideration.

In the last step, in an ion injector, oxygen ions were injected at an oxygen ion concentration of $10^{16}$–$10^{17}$ ions/cm² at 20–30 KV, whereby the outermost surface of the absorber 96 was converted into gold oxide 97 and the portion of the metal thin film 93 having no pattern thereon was converted into nickel oxide 98, as shown in FIG. 11D. When the ion injection is used at the suitably selected ion concentration and accelerating voltage, even the relatively thick film can be oxidized. Therefore, the metal thin film may be formed so that nickel oxide may have such a thickness as to become a reflection preventing film (690 Å in the case of an He-Ne laser).

As described above, nickel of the thin film was oxidized without peeling, and thus, there could be prevented the thickness reduction of gold constituting the X-ray absorber 96 and the generation of the film thickness non-uniformity of silicon nitride constituting the X-ray permeable film. Furthermore, owing to the presence of nickel oxide 97 in the portion having no pattern thereon, the deterioration of permeability was inhibited. That is, in the case of X rays, the deterioration of the permeability was only 4.2% and in the case of an He-Ne laser (6328 Å) for use in alignment, that of the permeability was 5.0%, and so there was no problem. In addition, when the position strain quantity of the X-ray absorber 96 was measured again by means of the light wave interference system coordinate measuring equipment, it decreased to 0.03 μm (the limit of measurement). Thus, the product can be used as a highly precise X-ray mask structure.

Example 9

FIGS. 12A to 12G illustrate as sectional views the ninth example of an X-ray mask structure manufacturing process according to the present invention.

As a material of a substrate 101 which will be a supporting frame, an Si wafer is often used, and in this example, an Si wafer having a diameter of 3 inches and a thickness of 1 mm was used. This substrate was set on a plasma CVD equipment. In the first step, back pressure was reduced to $1 \times 10^{-6}$ Torr, and 10 sccm of a 10% silane gas diluted with hydrogen and 10 sccm of a methane gas were fed through a hole perforated in a lower electrode. The substrate 101 was heated up to a temperature of 650° C. and a high-frequency power of 50 W was then applied under a pressure of $5 \times 10^{-3}$ Torr to form an X-ray permeable film 102 of silicon carbide having a thickness of 2 μm.

Figure 12A:
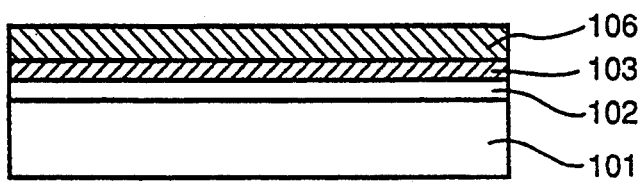
FIGS. 12A to 12G illustrate a ninth example of an X-ray mask structure manufacturing process of the present invention.
Figure 12B:
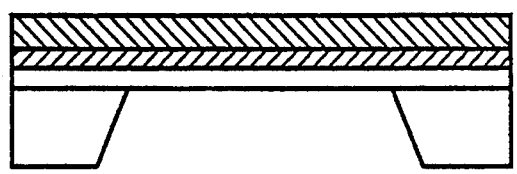

Afterward, the film was set on a two-dimensional sputtering equipment, and after back pressure was reduced to $2 \times 10^{-6}$ Torr, 10 sccm of an argon gas was fed thereto and a high frequency power of 100 W was then applied at a substrate temperature of 150° C. under a pressure of $10 \times 10^{-2}$ Torr to form a chromium film having a thickness of 50 nm which would be a metal thin film 103 for an absorber etching stopper. Furthermore, 500 W was continuously applied, thereby forming a W film of 800 nm in thickness which would be an X-ray absorber 106, as shown in FIG. 12A. As a material of the metal thin film 103, any metal can be used, so long as it is such as to have some difference of an etching grade as compared with a metal for the X-ray absorber. The back of the Si wafer was etched at 110° C. with a 30% by weight aqueous potassium hydroxide solution to form a supporting frame 101, as shown in FIG. 12B.

Figure 12C:
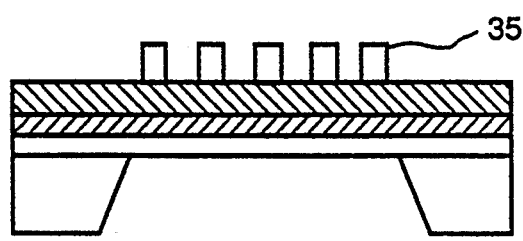

PIQ (trade name, made by Hitachi Chemical Co., Ltd.) which would be a lower resist layer and SNR (trade name, made by Toyo Soda Mfg. Co., Ltd.) which would be an upper resist layer containing Si were applied thereonto, and a desired fine resist pattern 105 was then formed by an electron rays depictor, as shown in FIG. 12C.

Figure 12D:
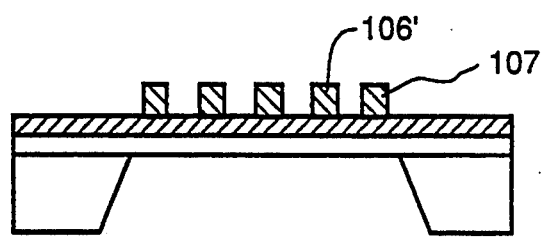
Figure 12E:
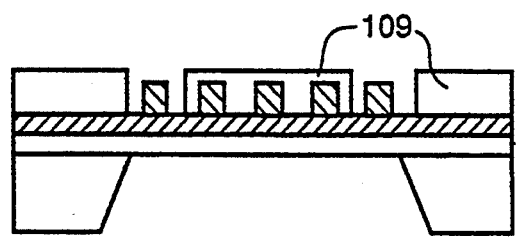

Next, W which would be an X-ray absorber 106 was etched by means of an RIE equipment. After back pressure was reduced to $1 \times 10^{-5}$ Torr, 50 sccm of a $CF_4$ gas was fed and 200 W was then applied under $5 \times 10^{-2}$ Torr to etch W. Since scarcely being etched with the $CF_4$ gas, chromium was not damaged, so that the X-ray absorber and an alignment mask took conformations represented by 106' and 107, as shown in FIG. 12D. The resist pattern 105 was etched simultaneously with the etching of W, but its remaining portion was peeled off with an exclusive peeling solution. A protective film 109 was formed with a novolak resist (trade name AZ-1370SF, made by Tokyo Oka Kogyo Co., Ltd.) on a circuit pattern portion, as shown in FIG. 12E.

Figure 12F:
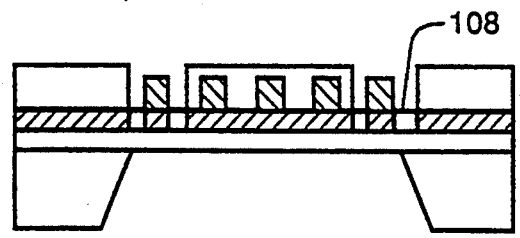
Figure 12G:
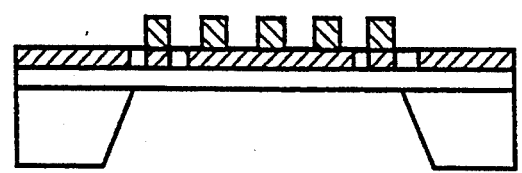

Afterward, 20 sccm of an oxygen gas was fed to the RIE equipment, and 200 W was then applied under $5 \times 10^{-2}$ Torr, so that by the irradiation of oxygen plasma, the portion of the metal thin film 103 having no alignment mark thereon which would be used for alignment was converted into a chromium oxide film having a thickness of 63 nm which would be a reflection preventing film 108, as shown in FIG. 12F. The remaining portion of the protective film 109 was peeled off with an exclusive peeling solution, as shown in FIG. 12G.

As described above, the portion of the metal thin film of chromium as an etching stopper on which any alignment mark was not formed and which would be used for the alignment was oxidized without peeling to form the reflection preventing film, whereby there could be prevented the reflection of alignment light, the generation of the positional deviation of tungsten constituting the X-ray absorber 106' due to the stress or its change of chromium oxide, the thickness reduction of the tungsten film, the generation of film thickness non-uniformity in the range of silicon carbide constituting the X-ray permeable film usable for the alignment, and the damage of the film surface.

This X-ray mask structure was set on an exposure chamber 8 (FIG. 18), and alignment was then carried out by the use of the alignment light from an He-Ne laser (633 nm). As a result, a stable alignment light permeability could be obtained, and precise alignment could be attained. In addition, when exposed to the X rays, the thickness reduction of the X-ray absorber was slight, so that a sufficient contrast could be obtained and the generation of the positional deviation could be prevented, and thus a highly precise semiconductor chip could be prepared.

Example 10

FIGS. 13A to 13E illustrate as sectional views the tenth example of an X-ray mask structure manufacturing process according to the present invention.

As a material of a substrate 111 which will be a supporting frame, an Si wafer is often used, and in this example, an Si wafer having a diameter of 3 inches and a thickness of 2 mm was used. This substrate was set on a plasma CVD equipment. In the first step, back pressure was reduced to $2 \times 10^{-6}$ Torr, and 5 sccm of a 10% silane gas diluted with hydrogen and 20 sccm of an ammonia gas were fed through a hole perforated in a lower electrode. The substrate 111 was heated up to a temperature of 350° C. and a high-frequency power of 20 W was then applied under a pressure of $5 \times 10^{-3}$ Torr to form an X-ray permeable film 112 of silicon nitride having a thickness of 2 μm.

Figure 13A:
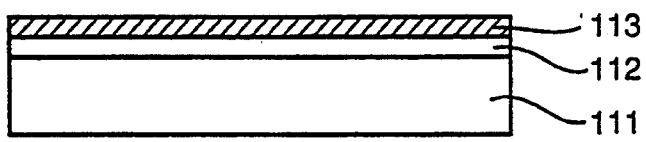
FIGS. 13A to 13E illustrate a tenth example of an X-ray mask structure manufacturing process of the present invention.
Figure 13B:
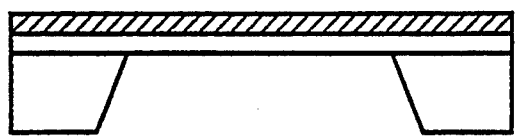
Figure 13C:
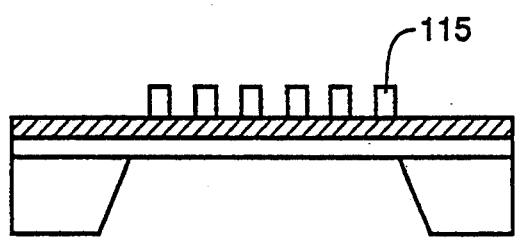

A nickel film having a thickness of 55 nm as a metal thin film 113 which would be a plating electrode for the formation of an X-ray absorber was deposited by an EB vapor deposition, as shown in FIG. 13A. The back of the Si wafer was then etched at 110° C. with a 30% by weight aqueous potassium hydroxide solution to form a supporting frame 111, as shown in FIG. 13B. An electron ray resist PMMA (trade name OEBR-1000, made by Tokyo Oka Kogyo Co., Ltd.) was applied thereonto, and a desired fine resist pattern 115 was then formed by means of an electron ray depictor, as shown in FIG. 13C.

Figure 13D:
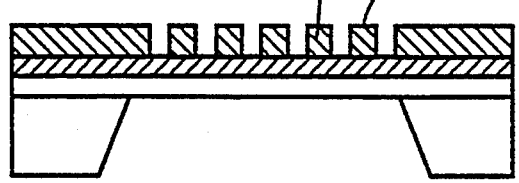

Next, plating was carried out at 50° C. at a current density of 0.5 mA/cm² by the use of a gold sulfite plating solution (trade name Neutronex 309, made by EEJA) to form a gold film which would be an X-ray absorber 116 and an alignment mark 117. Afterward, the resist pattern 115 was peeled off with an exclusive peeling solution, as shown in FIG. 13D.

Figure 13E:
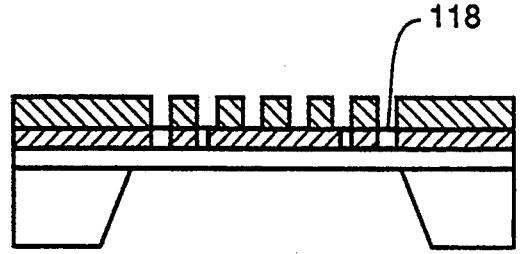

In the last step, in a focusing ion injector, oxygen ions were injected at an oxygen ion concentration of $10^{16}$–$10^{17}$ ions/cm² at 60–70 KV, whereby the region of the metal thin film 113 on which the alignment mark was not formed and which would be used for the alignment was oxidized to form a nickel oxide film having a thickness of 69 nm as a reflection preventing film 118, as shown in FIG. 13E.

As described above, the region of the metal thin film on which the alignment mark was not formed and which would be used for the alignment was only oxidized without peeling to form the reflection preventing film, whereby there could be prevented the reflection of alignment light, the positional deviation of the X-ray absorber 116 of gold due to the stress or its change of nickel oxide, the thickness reduction of the gold film, the generation of film thickness non-uniformity in the region of silicon nitride constituting the X-ray permeable film which would be used for the alignment, and the damage of the film surface.

This X-ray mask structure was set on an exposure chamber 8 (FIG. 18), and alignment was then carried out by the use of the alignment light from an He-Ne laser (633 nm). As a result, a stable alignment light permeability could be obtained, and precise alignment could be attained. In addition, when exposed to the X-rays, the thickness of the X-ray absorber was not decreased, so that a sufficient contrast could be obtained, and the positional deviation could also be prevented. Consequently, a highly precise semiconductor chip could be prepared.

Example 11

FIGS. 14A to 14H illustrate as sectional views the eleventh example of an X-ray mask structure manufacturing process according to the present invention.

As a material of a substrate 121 which will be a supporting frame, an Si wafer is often used, and in this example, an Si wafer having a diameter of 3 inches and a thickness of 2 mm was used. This substrate was set on a plasma CVD equipment.

In the first place, back pressure was reduced to $2 \times 10^{-6}$ Torr, and 5 sccm of a 10% silane gas diluted with hydrogen and 20 sccm of an ammonia gas were fed through a hole perforated in a lower electrode. The substrate 121 was heated up to a temperature of 250° C. and a high-frequency power of 20 W was then applied under a pressure of $5 \times 10^{-3}$ Torr to form an X-ray permeable film 122 of silicon nitride having a thickness of 2 μm.

Figure 14A:
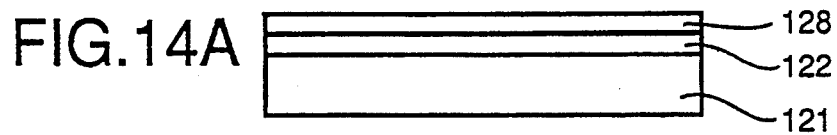
FIGS. 14A to 14H illustrate an eleventh example of an X-ray mask structure manufacturing process of the present invention.
Figure 14B:
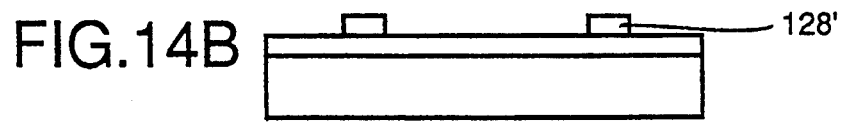

Afterward, this substrate was set on a sputtering equipment, and a chromium oxide film 128 having a thickness of 57 nm and constituting a part of a reflection preventing film was formed, as shown in FIG. 14A. The resist was patterned into a shape of a scribe line corresponding to the peripheral portion of a circuit pattern, and then etched to form a part 128' of the reflection preventing film having the scribe line shape. The remaining resist, if any, was peeled off, as shown in FIG. 14B.

Figure 14C:
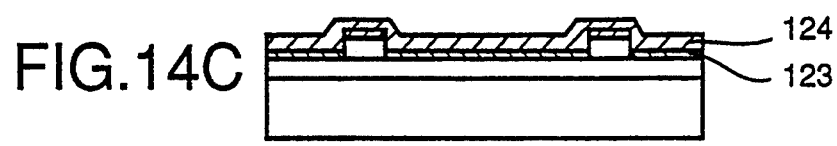

A gold film having a thickness of 50 nm which would be a plating electrode 124 for the formation of an X-ray absorber and a chromium film having a thickness of 5 nm as a metal thin film 123 for adhesion were continuously deposited by an EB vapor deposition, as shown in FIG. 14C.

Figure 14D:
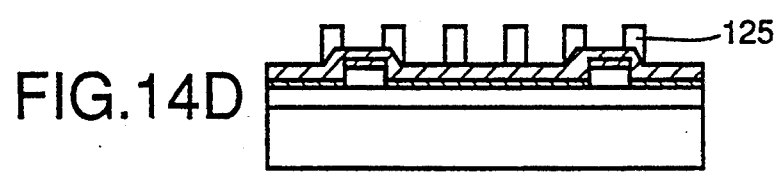
Figure 14E:
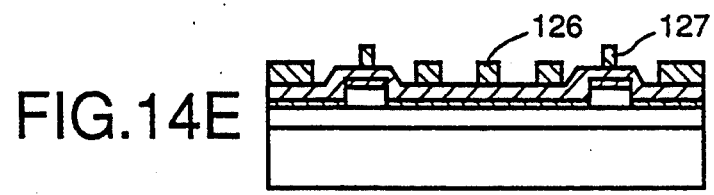

An electron ray resist PMMA (trade name OEBR-1000, made by Tokyo Oka Kogyo Co., Ltd.) was applied thereonto, and a desired fine resist pattern 125 was then formed by means of an electron ray depictor, as shown in FIG. 14D. Next, plating was carried out at 50° C. at a current density of 1 mA/cm² by the use of a gold sulfite plating solution (trade name Neutronex 309, made by EEJA) to form a gold film which would be an X-ray absorber 126 and an alignment mark 127. Afterward, the resist pattern 125 was peeled off with an exclusive peeling solution, as shown in FIG. 14E.

Figure 14F:
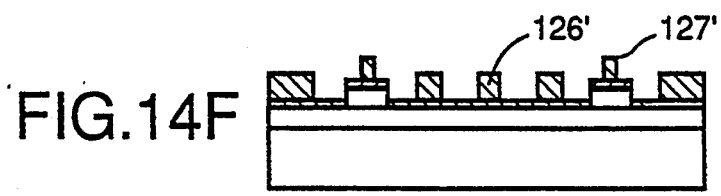

The portion of the plating electrode 124 on which the X-ray absorber 126 and the alignment mark 127 were not formed was peeled off by means of an RIE equipment. After back pressure was reduced to $1 \times 10^{-5}$ Torr, 20 sccm of an argon gas was fed thereto and 200 W was then applied under a pressure of $5 \times 10^{-2}$ Torr to carry out etching. Since the plating electrode 124, the X-ray absorber 126 and the alignment mark 127 were all made of gold, they were equally etched, so that the X-ray absorber and the alignment mark took the conformations of 126' and 127', as shown in FIG. 14F.

Figure 14G:
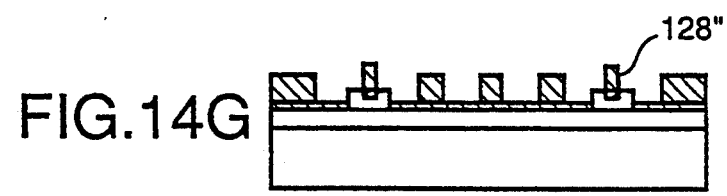

Afterward, 20 sccm of an oxygen gas was fed to the RIE equipment, and 200 W was then applied thereonto under $5 \times 10^{-2}$ Torr and thus the laminate was irradiated with oxygen plasma, whereby the portion of the metal thin film 123 having no pattern thereon was converted into chromium oxide, with the result that a chromium oxide film having a thickness of 63 nm was formed as a reflection preventing film 128" in addition to the previously formed film 128', as shown in FIG. 14G.

Figure 14H:
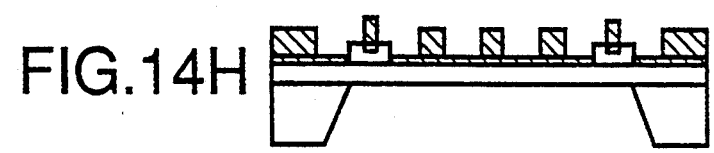

In the last step, the back of the Si wafer was etched at 110° C. with a 30% by weight aqueous potassium hydroxide solution to form a supporting frame 121, as shown in FIG. 14H.

As shown in FIG. 14H, the chromium oxide film was formed all over the portion of the X-ray permeable film having no pattern thereon. However, since the chromium oxide film was as thin as 7 nm, the positional deviation of the X-ray absorber 126' was not brought about by the stress or its change of the film. The portion of the metal thin film 123 on the scribe line having no alignment mark thereon functioned as the reflection preventing film together with the previously formed chromium oxide. Furthermore, the thickness reduction of the gold film which was the X-ray absorber 126' could be prevented.

This X-ray mask structure was set on an exposure chamber 8 (FIG. 18), and alignment was then carried out by the use of alignment light from an He-Ne laser (633 nm). As a result, a stable alignment light permeability could be obtained, and highly precise alignment could be attained. In addition, when exposed to the X rays, the thickness of the X-ray absorber was not decreased, so that a sufficient contrast could be obtained, and the positional deviation could also be prevented. Consequently, a highly precise semiconductor chip could be prepared.

Example 12

FIGS. 15A to 15H illustrate as sectional views the twelfth example of an X-ray mask structure manufacturing process according to the present invention.

As a material of a substrate 131 which will be a supporting frame, an Si wafer is often used, and in this example, an Si wafer having a diameter of 3 inches and a thickness of 2 mm was used. This substrate was set on a plasma CVD equipment. In the first step, back pressure was reduced to $2 \times 10^{-6}$ Torr, and 5 sccm of a 10% silane gas diluted with hydrogen and 20 sccm of an ammonia gas were fed through a hole perforated in a lower electrode. The substrate 131 was heated up to a temperature of 250° C. and a high-frequency power of 20 W was then applied under a pressure of $5 \times 10^{-3}$ Torr to form an X-ray permeable film 132 of silicon nitride having a thickness of 2 μm.

A gold film having a thickness of 500 Å which would be a plating electrode 134 for the formation of an X-ray absorber and a chromium film having a thickness of 50 Å as a metal thin film 133 for adhesion were continuously deposited by an EB vapor deposition, as shown in FIG. 15A. A material of the metal thin film 133 is a metal capable of improving adhesive strength such as Ti, Al or Zn. An electron ray resist PMMA (trade name OEBR-1000, made by Tokyo Oka Kogyo Co., Ltd.) was applied thereonto, and a desired fine resist pattern 135 was then formed by means of an electron rays depictor, as shown in FIG. 15B.

Next, plating was carried out at 50° C. at a current density of 1 mA/cm² by the use of a gold sulfite plating solution (trade name Neutronex 309, made by EEJA) to form a gold film which would be an X-ray absorber 136 and an alignment mark 137. Afterward, the resist pattern 135 was peeled off with an exclusive peeling solution, as shown in FIG. 15C.

The portion of the plating electrode 134 on which the X-ray absorber 136 and the alignment mark 137 were not formed was peeled by means of an equipment. After back pressure was reduced to $1 \times 10^{-5}$ Torr, 20 sccm of an argon gas was fed thereto and 200 W was then applied under a pressure of $5 \times 10^{-2}$ Torr to carry out etching. Since the plating electrode 134, the X-ray absorber 136 and the alignment mark 137 were all made of gold, they were equally etched, so that the X-ray absorber and the alignment mark took the conformations of 136' and 137', as shown in FIG. 15D.

A protective film 138 was then formed on a circuit pattern portion by the use of a novolak resist (trade name AZ-1370SF, made by Tokyo Oka Kogyo Co., Ltd.), as shown in FIG. 15E. Furthermore, 20 sccm of an oxygen gas was fed to the RIE equipment, and 200 W was then applied under a pressure of $5 \times 10^{-2}$ Torr, with the result that the portion of the metal thin film 133 on a scribe line having no alignment mark thereon was oxidized with oxygen plasma to form a chromium oxide film 139, as shown in FIG. 15F.

Afterward, the protective film 138 was peeled off with an exclusive peeling solution, as shown in FIG. 15G. Alternatively, an inorganic film of $SiO_2$ or the like may be formed as the protective film 138 by sputtering or the like, and it may be maintained as the protective film for the X-ray mask. In the last step, the back of the Si wafer was etched at 110° C. with a 3% by weight aqueous potassium hydroxide solution to form a supporting frame 131, as shown in FIG. 15H. FIG. 15I shows a plan view of the constitution of FIG. 15H.

In such an X-ray mask structure as in FIG. 15H, the portion of the metal thin film for adhesion of chromium on the scribe line on which the alignment mark was not formed was only oxidized without etching, and therefore there could be prevented the thickness reduction of the gold film which was the X-ray absorber 136', the generation of the film thickness non-uniformity of silicon nitride constituting the X-ray permeable film on the scribe line, and the damage of the film surface. This X-ray mask structure was set on an exposure chamber 8 (FIG. 18), and alignment was then carried out by the use of alignment light from an He-Ne laser (633 nm). As a result, a stable alignment light permeability could be obtained, and highly precise alignment could be attained. In addition, when exposed to the X-rays, the thickness of the X-ray absorber was not decreased, so that a sufficient contrast could be obtained. Consequently, a highly precise semiconductor chip could be prepared.

Example 13

FIGS. 16A to 16H illustrate as sectional views the thirteenth example of an X-ray mask structure manufacturing process according to the present invention.

As a material of a substrate 141 which will be a supporting frame, an Si wafer is often used, and in this example, an Si wafer having a diameter of 3 inches and a thickness of 2 mm was used. This substrate was set on a plasma CVD equipment. In the first step, back pressure was reduced to $2 \times 10^{-6}$ Torr, and 5 sccm of a 10% silane gas diluted with hydrogen and 20 sccm of an ammonia gas were fed through a hole perforated in a lower electrode. The substrate 141 was heated up to a temperature of 350° C. and a high-frequency power of 20 W was then applied under a pressure of $5 \times 10^{-3}$ Torr to form an X-ray permeable film 142 of silicon nitride having a thickness of 2 μm.

Figure 16A:
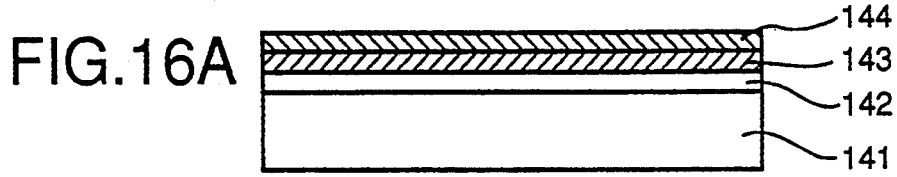
FIGS. 16A to 16H illustrate a thirteenth example of an X-ray mask structure manufacturing process of the present invention.
Figure 16B:
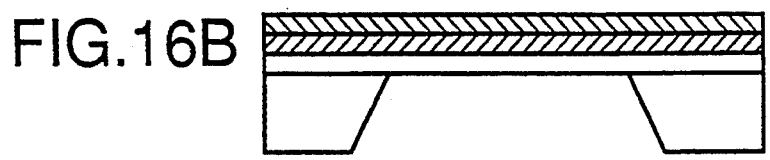
Figure 16C:
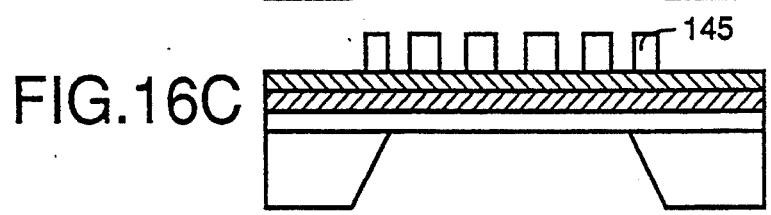

A gold film having a thickness of 500 Å which would be a plating electrode 144 for the formation of an X-ray absorber and a titanium film having a thickness of 50 Å as a metal thin film 143 for adhesion were continuously deposited by an EB vapor deposition, as shown in FIG. 16A. Next, the back of the Si wafer was etched at 110° C. with a 30% by weight aqueous potassium hydroxide solution to form a supporting frame 141, as shown in FIG. 16B. An electron ray resist PMMA (trade name OEBR-1000, made by Tokyo Oka Kogyo Co., Ltd.) was applied thereonto, and a desired fine resist pattern 145 was then formed by means of an electron ray depictor, as shown in FIG. 16C.

Figure 16D:
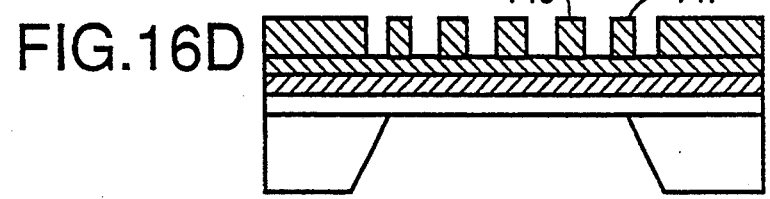

Next, plating was carried out at 50° C. at a current density of 1 mA/cm² by the use of a gold sulfite plating solution (trade name Neutronex 309, made by EEJA) to form a gold film which would be an X-ray absorber 146 and an alignment mark 147. Afterward, the resist pattern 145 was peeled off with an exclusive peeling solution, as shown in FIG. 16D.

Figure 16E:
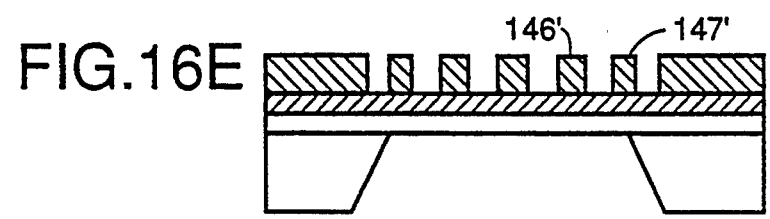
Figure 16F:
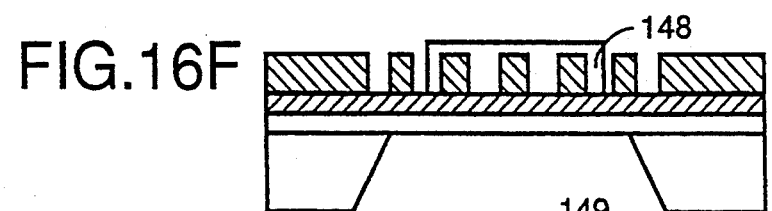

The portion of the plating electrode 144 on which the X-ray absorber 146 and the alignment mark 147 were not formed was peeled by means of an RIE equipment. After back pressure was reduced to $1 \times 10^{-5}$ Torr, 20 sccm of an argon gas was fed thereto and 200 W was then applied under a pressure of $5 \times 10^{-2}$ Torr to carry out etching. Since the plating electrode 144, the X-ray absorber and the alignment mark were all made of gold, they were equally etched, so that the X-ray absorber and the alignment mark took the conformations of 146' and 147', as shown in FIG. 16E. A protective film 148 was then formed on a circuit pattern portion by the use of a novolak resist (trade name AZ-1370SF, made by Tokyo Oka Kogyo Co., Ltd.), as shown in FIG. 16F.

Figure 16G:
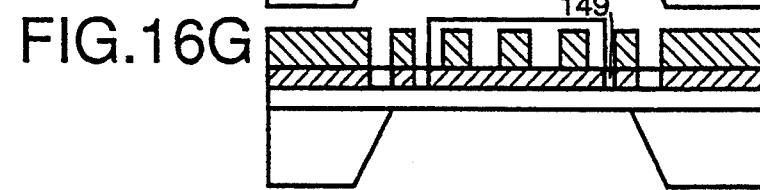
Figure 16H:
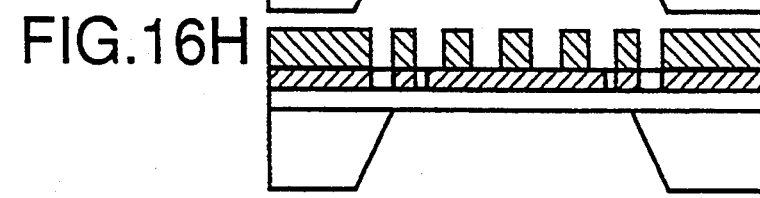

Furthermore, a heat treatment was carried out at 100° C. in an oxygen atmosphere, and a region of the metal thin film 143 on which the alignment mark was not formed and which would be used for the alignment was oxidized to form a titanium oxide film 149, as shown in FIG. 16G. The protective film 148 was peeled off with an exclusive peeling solution, as shown in FIG. 16H. Alternatively, an inorganic film of $SiO_2$ or the like may be formed as the protective film 148 by sputtering or the like, and it may be maintained as the protective film for the X-ray mask.

As described above, the region of the metal thin film of chromium for adhesion on which the alignment mark was not formed and which would be used for the alignment was oxidized without etching, and therefore there could be prevented the thickness reduction of the gold film which was the X-ray absorber 146', the generation of film thickness non-uniformity in the range of silicon nitride constituting the X-ray permeable film which would be used for the alignment, and the damage of the film surface. As in Example 12, this X-ray mask structure was set on an exposure chamber, and alignment was then carried out by the use of alignment light from an He-Ne laser (633 nm). As a result, a stable alignment light permeability could be obtained, and highly precise alignment could be attained. In addition, when exposed to the X-rays, the thickness of the X-ray absorber was not decreased, so that a sufficient contrast could be obtained. Consequently, a highly precise semiconductor chip could be prepared.

Example 14

FIGS. 17A to 17E illustrate as sectional views the fourteenth example of an X-ray mask structure manufacturing process according to the present invention.

As a material of a substrate 151 which would be a supporting frame, an Si wafer was used. A silicon nitride film having a thickness of 2 μm was formed as an X-ray permeable film 152 in the same manner as in Example 13.

Figure 17A:
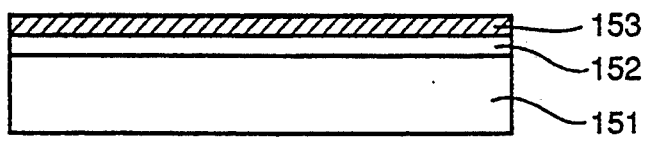
FIGS. 17A to 17E illustrate a fourteenth example of an X-ray mask structure manufacturing process of the present Invention.
Figure 17B:
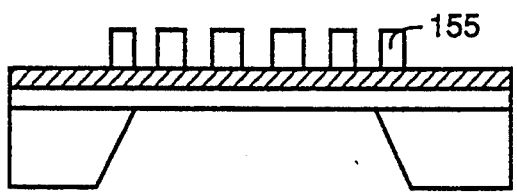

A nickel film having a thickness of 20 nm as a metal thin film 153 which would be a plating electrode for the formation of an X-ray absorber was deposited by an EB vapor deposition, as shown in FIG. 17A. An electron ray resist PMMA (trade name OEBR-1000, made by Tokyo Oka Kogyo Co., Ltd.) was applied thereonto, and a desired fine resist pattern 155 was then formed by means of an electron ray depictor, as shown in FIG. 17B.

Figure 17C:
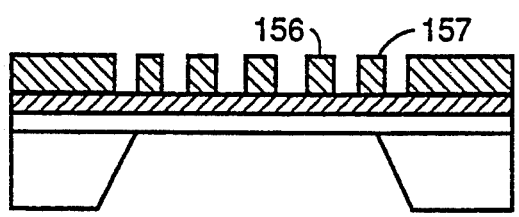
Figure 17D:
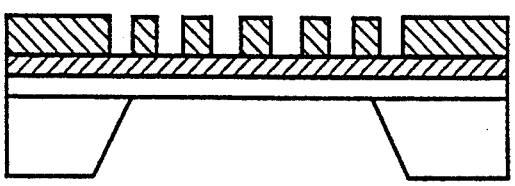

Next, plating was carried out at 50° C. at a current density of 0.5 mA/cm$^2$ by the use of a gold sulfite plating solution (trade name Neutronex 309, made by EEJA) to form a gold film which would be an X-ray absorber 156. Afterward, the resist pattern 155 was peeled off with an exclusive peeling solution, as shown in FIG. 17C. Afterward, the back of the Si wafer was etched at 110° C. with a 30% by weight aqueous potassium hydroxide solution to form a supporting frame 151, as shown in FIG. 17D.

Figure 17E:
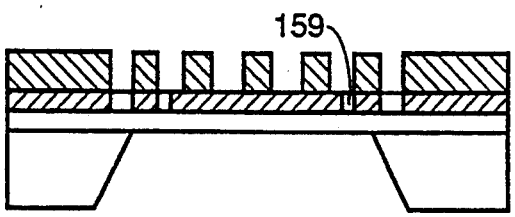

In the last step, in a focusing ion injector, oxygen ions were injected at an oxygen ion concentration of $10^{16}$–$10^{17}$ ions/cm$^2$ at 40–50 KV, whereby a region of the metal thin film 153 on which the alignment mark was not formed and which would be used for the alignment was converted into nickel oxide 159, as shown in FIG. 17E. The utilization of the focusing ion injector technique permits omitting the preparation and the peeling of a protective film. Furthermore, when the ion injection is used at the suitably selected ion concentration and accelerating voltage, even the relatively thick Film can be oxidized. Therefore, the metal thin film may be formed so that nickel oxide may have such a thickness as to become a reflection preventing film (690 Å in the case of an He-Ne laser).

As described above, the region of the metal thin film of nickel on which the alignment mark was not formed and which would be used for the alignment was oxidized without peeling, and therefore there could be prevented the thickness reduction of the gold film which was the X-ray absorber 156, the generation of film thickness non-uniformity in the range of silicon nitride constituting the X-ray permeable film which would be used for the alignment, and the damage of the film surface. As in Example 12, this X-ray mask structure was set on an exposure chamber, and alignment was then carried out by the use of alignment light from an He-Ne laser (633 nm). As a result, a stable alignment light permeability could be obtained, and highly precise alignment could be attained. In addition, when exposed to the X-rays, the thickness of the X-ray absorber was not decreased, so that a sufficient contrast could be obtained. Consequently, a highly precise semiconductor chip could be prepared.

What is claimed is:

1. An X-ray mask structure comprising:
   an X-ray absorber having a masking pattern;
   an X-ray permeable film for supporting the X-ray absorber on one surface of the X-ray permeable film;
   a supporting frame for supporting the X-ray permeable film; and
   a metal oxide film formed on a portion of the one surface of the X-ray permeable film having no X-ray absorber thereon.

2. The X-ray mask structure according to claim 1, wherein the metal oxide film has a thickness of 8 Å to 1000 Å.

3. The X-ray mask structure according to claim 1, wherein time metal oxide film comprises an oxide of a metal having an atomic number of 35 or less.

4. The X-ray mask structure according to claim 3, wherein the metal is at least one selected from the group consisting of chromium, titanium, aluminum, zinc, copper and nickel.

5. The X-ray mask structure according to claim 3, wherein the X-ray absorber has an oxide film of a metal having an atomic number of 70 or more.

6. The X-ray mask structure according to claim 5, wherein the metal having an atomic number of 70 or more is at least one selected from the group consisting of tantalum, Tungsten, platinum, gold and lead.

7. The X-ray mask structure according to claim 1, wherein an intermediate layer is formed between the X-ray permeable film and the X-ray absorber, and the metal oxide film is an oxide of a metal constituting the intermediate layer.

8. The X-ray mask structure according to claim 7, wherein the metal oxide film has a thickness of 8 Å to 1000 Å.

9. The X-ray mask structure according to claim 7, wherein the metal oxide film comprises an oxide of a metal having an atomic number of 35 or less.

10. The X-ray mask structure according to claim 9, wherein the metal is at least one selected from the group consisting of chromium, titanium, aluminum, zinc, copper and nickel.

11. The X-ray mask structure according to claim 9, wherein the X-ray absorber has an oxide film of a metal having an atomic number of 70 or more.

12. The X-ray mask structure according to claim 11, wherein the metal having an atomic number of 70 or more is at least one selected from the group consisting of tantalum, tungsten, platinum, gold and lead.

13. An X-ray mask structure according to claim 1, wherein (i) the X-ray permeable film supports the X-ray absorber on an upper surface of the X-ray permeable film, (ii) the supporting frame supports the X-ray permeable film from a lower surface of the X-ray permeable film and (iii) the metal oxide film is formed on the upper surface of the X-ray permeable film and on the portion having no X-ray absorber thereon.

14. An X-ray mask structure comprising:
   an X-ray absorber having a masking pattern;
   an alignment mark;
   an X-ray permeable film for supporting the X-ray absorber and the mark on a surface of the X-ray permeable film;
   a supporting frame for supporting the X-ray permeable film; and
   a metal oxide film formed on at least a portion of the surface of the X-ray permeable film in the vicinity of the mark and having no X-ray absorber thereon.

15. The X-ray mask structure according to claim 13, wherein the metal oxide film is formed on the portion of the X-ray permeable film having no alignment mark thereon.

16. The X-ray mask structure according to claim 14, wherein the metal oxide film has a thickness of 8 Å to 1000 Å.

17. The X-ray mask structure according to claim 14, wherein the metal oxide film comprises an oxide of a metal having an atomic number of 35 or less.

18. The X-ray mask structure according to claim 17, wherein the metal is at least one selected from the group consisting of chromium, titanium, aluminum, zinc, copper and nickel.

19. The X-ray mask structure according to claim 17, wherein the X-ray absorber comprises an oxide film of a metal having an atomic number of 70 or more.

20. The X-ray mask structure according to claim 19, wherein the metal having an atomic number of 70 or more is at least one selected from the group consisting of tantalum, tungsten, platinum, gold and lead.

21. The X-ray mask structure according to claim 14 further comprising an intermediate layer formed between the X-ray absorber and the X-ray permeable film, and between the alignment mark and the X-ray permeable film.

22. The X-ray mask structure according to claim 21, wherein the metal oxide film has a thickness of 8 Å to 1000 Å.

23. The X-ray mask structure according to claim 21, wherein the metal oxide film comprises an oxide of a metal having an atomic number of 35 or less.

24. The X-ray mask structure according to claim 23, wherein the metal is at least one selected from the group consisting of chromium, titanium, aluminum, zinc, copper and nickel.

25. The X-ray mask structure according to claim 23, wherein the X-ray absorber comprises an oxide film of a metal having an atomic number of 70 or more.

26. The X-ray mask structure according to claim 25, wherein the metal having an atomic number of 70 or more is at least one selected from the group consisting of tantalum, tungsten, platinum, gold and lead.

27. The X-ray mask structure according to claim 14, wherein the alignment mark is formed on the metal oxide film.

28. An X-ray mask structure according to claim 14, wherein (i) the X-ray permeable film supports the X-ray absorber on an upper surface of the X-ray permeable film, (ii) the supporting frame supports the X-ray permeable film from a lower surface of the X-ray permeable film and (iii) the metal oxide film is formed on the upper surface of the X-ray permeable film and on the portion having no X-ray absorber thereon.

29. A semiconductor device manufactured by irradiating a material to be exposed with X-rays through an X-ray mask structure comprising (i) an X-ray absorber having a masking pattern, (ii) an X-ray permeable film supporting the X-ray absorber on one surface of the X-ray permeable film, (iii) a supporting frame supporting the X-ray permeable film and (iv) a metal oxide film formed on a portion of the surface of the X-ray permeable film having no X-ray absorber thereon.

30. A semiconductor device according to claim 29, wherein (i) the X-ray permeable film supports the X-ray absorber on an upper surface of the X-ray permeable film, (ii) the supporting frame supports the X-ray permeable film from a lower surface of the X-ray permeable film and (iii) the metal oxide film is formed on the upper surface of the X-ray permeable film and on the portion having no X-ray absorber thereon.

31. A method for manufacturing an X-ray mask structure comprising:
forming an X-ray absorber including a masking pattern, an X-ray permeable film supporting the X-ray absorber on one surface of the X-ray permeable film, and a supporting frame supporting the X-ray permeable film; and
thereafter subjecting a portion of the one surface of the X-ray permeable film having no X-ray absorber pattern thereon to an oxidation treatment.

32. The method for manufacturing an X-ray mask structure according to claim 31, wherein the oxidation treatment is an oxygen plasma treatment.

33. The method for manufacturing an X-ray mask structure according to claim 31, wherein the oxidation treatment is an oxygen ion injection treatment.

34. The method for manufacturing an X-ray mask structure according to claim 31, wherein the oxidation treatment is a heat treatment in an oxygen atmosphere.

35. The method for manufacturing an X-ray mask structure according to claim 31, further comprising subjecting the surface of the X-ray absorber pattern to an oxidation treatment.

36. The method for manufacturing an X-ray mask structure according to claim 35, wherein the oxidation treatment is an oxygen plasma treatment.

37. The method for manufacturing an X-ray mask structure according to claim 35, wherein the oxidation treatment is an oxygen ion injection treatment.

38. The method for manufacturing an X-ray mask structure according to claim 35, wherein the oxidation treatment is a heat treatment in an oxygen atmosphere.

39. The method for manufacturing an X-ray mask structure according to claim 35, wherein the oxidation treatment of the X-ray permeable film and the oxidation treatment of the X-ray absorber are carried out in one process.

40. A method according to claim 31, wherein (i) the X-ray permeable film supports the X-ray absorber on an upper surface of the X-ray permeable film, (ii) the supporting frame supports the X-ray permeable film from a lower surface of the X-ray permeable film and (iii) the subjecting step comprises subjecting a portion of the upper surface of the X-ray permeable film having no X-ray absorber pattern thereon to an oxidation treatment.

41. A method for manufacturing an X-ray mask structure comprising:
forming an X-ray absorber including a masking pattern, an X-ray permeable film supporting the X-ray absorber on one surface of the X-ray permeable film, and a supporting frame supporting the X-ray permeable film;
forming a metal film on the one surface of the X-ray permeable film;
forming an X-ray absorber pattern on the metal film; and
thereafter, subjecting a portion of the one surface of the metal film having no X-ray absorber pattern thereon to an oxidation treatment.

42. The method for manufacturing an X-ray mask structure according to claim 41, wherein the oxidation treatment is an oxygen ion injection treatment.

43. The method for manufacturing an X-ray mask structure according to claim 41, wherein the oxidation treatment is a heat treatment in an oxygen atmosphere.

44. The method for manufacturing an X-ray mask structure according to claim 41, further comprising subjecting the surface of the X-ray absorber pattern to an oxidation treatment.

45. The method for manufacturing an X-ray mask structure according to claim 44, wherein the oxidation treatment is an oxygen plasma treatment.

46. The method for manufacturing an X-ray mask structure according to claim 44, wherein the oxidation treatment is an oxygen ion injection treatment.

47. The method for manufacturing an X-ray mask structure according to claim 44, wherein the oxidation treatment is a heat treatment in an oxygen atmosphere.

48. The method for manufacturing an X-ray mask structure according to claim 44, wherein the oxidation treatment of the metal film on the X-ray permeable film and the oxidation treatment of the X-ray absorber are carried out in one process.

49. The method for manufacturing an X-ray mask structure according to claim 41, wherein said oxidation treatment step comprises producing an oxide film of the metal, in order to increase permeability of at least alignment light.

50. The method for manufacturing an X-ray mask structure according to claim 41, wherein the oxidation treatment is an oxygen plasma treatment.

51. A method according to claim 41, wherein (i) the X-ray-permeable film supports the X-ray absorber on an upper surface of the X-ray permeable film, (ii) the supporting frame supports the X-ray permeable film from a lower surface of the X-ray permeable film, (iii) the metal film is formed on the upper surface of the X-ray permeable film and (iv) the subjecting step comprises subjecting a portion of the upper surface of the metal film having no X-ray absorber thereon to an oxidation treatment.

52. A semiconductor device manufactured by irradiating a material to be exposed with X-rays through an X-ray mask structure comprising (i) an X-ray absorber having a masking pattern, (ii) an alignment mark, (iii) an X-ray permeable film supporting the X-ray absorber and the mark on a surface of the X-ray permeable film, (iv) a supporting frame supporting the X-ray permeable film and (v) a metal oxide film formed on at least a portion of the surface of the X-ray permeable film in the vicinity of the mark and having no X-ray absorber thereon, to form a circuit pattern on the material to be exposed.

53. A semiconductor device according to claim 52, wherein (i) the X-ray permeable film supports the X-ray absorber and the mark on the upper surface of the X-ray permeable film, (ii) the supporting frame supports the X-ray permeable film from a lower surface of the X-ray permeable film and (iii) the metal oxide film is formed on the upper surface of the X-ray permeable film and on at least the portion in the vicinity of the mark and having no X-ray absorber thereon.

54. An X-ray exposing method which comprises a step of irradiating a material to be exposed with X-rays through an X-ray mask structure comprising (i) an X-ray absorber having a masking pattern, (ii) an alignment mark, (iii) an X-ray permeable film supporting the X-ray absorber and the mark on a surface of the X-ray permeable film, (iv) a supporting frame supporting the X-ray permeable film and (v) a metal oxide film formed on at least a portion of the surface of the X-ray permeable film in the vicinity of the mark and having no X-ray absorber thereon.

55. An X-ray exposing method according to claim 54, wherein (i) the X-ray permeable film supports the X-ray absorber and the mark on the upper surface of the X-ray permeable film, (ii) the supporting frame supports the X-ray permeable film from a lower surface of the X-ray permeable film and (iii) the metal oxide film is formed on the upper surface of the X-ray permeable film and on at least the portion in the vicinity of the mark and having no X-ray absorber thereon.

56. An X-ray exposing method which comprises a step of irradiating a material to be exposed with X-rays through an X-ray mask structure comprising (i) an X-ray absorber having a masking pattern, (ii) an alignment mark, (iii) an X-ray permeable film supporting the X-ray absorber and the mark on a surface of the X-ray permeable film, (iv) a supporting frame supporting the X-ray permeable film and (v) a metal oxide film formed on at least a portion of the surface of the X-ray permeable film in the vicinity of the mark and having no X-ray absorber thereon, after alignment is carried out between the mask structure and the material to be exposed.

57. An X-ray exposing method according to claim 56, wherein (i) the X-ray permeable film supports the X-ray absorber and the mark on the upper surface of the X-ray permeable film, (ii) the supporting frame supports the X-ray permeable film from a lower surface of the X-ray permeable film and (iii) the metal oxide film is formed on the upper surface of the X-ray permeable film and on at least the portion in the vicinity of the mark and having no X-ray absorber thereon.

58. A semiconductor device manufactured by irradiating a material to be exposed with X-rays through an X-ray mask structure comprising (i) an X-ray absorber having a masking pattern, (ii) an alignment mark, (iii) an X-ray permeable film supporting the X-ray absorber and the mark on a surface of the X-ray permeable film, (iv) a supporting frame supporting the X-ray permeable film and (v) a metal oxide film formed on at least a portion of the surface of the X-ray permeable film in the vicinity of the mark and having no X-ray absorber thereon, after alignment is carried out between the mask structure and the material to be exposed, thereby forming a circuit pattern on the material to be exposed.

59. A semiconductor device according to claim 58, wherein (i) the X-ray permeable film supports the X-ray absorber and the mark on the upper surface of the X-ray permeable film, (ii) the supporting frame supports the X-ray permeable film from a lower surface of the X-ray permeable film and (iii) the metal oxide film is formed on the upper surface of the X-ray permeable film and on at least the portion in the vicinity of the mark and having no X-ray absorber thereon.

60. An X-ray exposing method which comprises a step of irradiating a material to be exposed with X-rays through an X-ray mask structure comprising (i) an X-ray absorber having a masking pattern, (ii) an X-ray permeable film supporting the X-ray absorber on one surface of the X-ray permeable film, (iii) a supporting frame supporting the X-ray permeable film and (iv) a metal oxide film formed on a portion of the one surface of the X-ray permeable film having no X-ray absorber thereon.

61. An X-ray exposing method according to claim 60, wherein (i) the X-ray permeable film supports the X-ray absorber on an upper surface of the X-ray permeable film, (ii) the supporting frame supports the X-ray permeable film from a lower surface of the X-ray permeable film and (iii) the metal oxide film is formed on the upper surface of the X-ray permeable film and on the portion having no X-ray absorber thereon.

62. An X-ray exposing method which comprises a step of irradiating a material to be exposed with X-rays through an X-ray mask structure comprising (i) an X-ray absorber having a masking pattern, (ii) an X-ray permeable film supporting the X-ray absorber on one surface of the X-ray permeable film, (iii) a supporting frame supporting the X-ray permeable film and (iv) a metal oxide film formed on a portion of the one surface of the X-ray permeable film having no X-ray absorber thereon, after alignment is carried out between the mask structure and the material to be exposed.

63. An X-ray exposing method according to claim 62, wherein (i) the X-ray permeable film supports the X-ray absorber on an upper surface of the X-ray permeable film, (ii) the supporting frame supports the X-ray permeable film from a lower surface of the X-ray permeable film and (iii) the metal oxide film is formed on the upper surface of the X-ray permeable film and on the portion having no X-ray absorber thereon.

64. A semiconductor device manufactured by irradiating a material to be exposed with X-rays through an X-ray mask structure comprising (i) an X-ray absorber having a masking pattern, (ii) an X-ray permeable film supporting the X-ray absorber on one surface of the X-ray permeable film, (iii) a supporting frame supporting the X-ray permeable film and (iv) a metal oxide film formed on a portion of the one surface of the X-ray permeable film having no X-ray absorber thereon, after alignment is carried out between the mask structure and the material to be exposed, thereby forming a circuit pattern on the material to be exposed.

65. A semiconductor device according to claim 64, wherein (i) the X-ray permeable film supports the X-ray absorber on an upper surface of the X-ray permeable film, (ii) the supporting frame supports the X-ray permeable film from a lower surface of the X-ray permeable film and (iii) the metal oxide film is formed on the upper surface of the X-ray permeable film and on the portion having no X-ray absorber thereon.

* * * * *

UNITED STATES PATENT AND TRADEMARK OFFICE
CERTIFICATE OF CORRECTION

PATENT NO. : 5,422,921
DATED : June 6, 1995
INVENTOR(S) : KEIKO CHIBA

It is certified that error appears in the above-indentified patent and that said Letters Patent is hereby corrected as shown below:

COLUMN 1, line 19, "Integrated" should read --integrated--.

COLUMN 3, line 26, "Irradiating" should read --irradiating--; and
    line 66, "SE Illustrate" should read --5E illustrate--.

COLUMN 4, line 35, "Invention" should read --invention--.

COLUMN 6, line 34, "X rays." should read --X-rays.--; and
    line 38, "The" should read --the--.

COLUMN 11, line 49, "rays" should read --ray--.

UNITED STATES PATENT AND TRADEMARK OFFICE
CERTIFICATE OF CORRECTION

PATENT NO. : 5,422,921
DATED : June 6, 1995
INVENTOR(S) : KEIKO CHIBA

It is certified that error appears in the above-indentified patent and that said Letters Patent is hereby corrected as shown below:

COLUMN 12, line 7, "In" should read --in--;
line 11, "X rays," should read --X-rays,--; and
line 41, "rays" should read --ray--.

COLUMN 15, line 20, "X" should read --X- --;
line 21, "ray-absorber" should read --ray absorber--; and
line 44, "The" should read --the--.

COLUMN 16, line 1, "rays" should read --ray--.

COLUMN 17, line 26, "rays" should read --ray--; and
line 39, "novolak" should read --novolac--.

UNITED STATES PATENT AND TRADEMARK OFFICE
CERTIFICATE OF CORRECTION

PATENT NO. : 5,422,921
DATED : June 6, 1995
INVENTOR(S) : KEIKO CHIBA

It is certified that error appears in the above-indentified patent and that said Letters Patent is hereby corrected as shown below:

COLUMN 18, line 2, "X" should read --X- --.

COLUMN 19, line 18, "place," should read --step,--.

COLUMN 20, line 28, "X" should read --X- --; and
    line 62, "rays" should read --ray--.

COLUMN 21, line 15, "novolak" should read --novolac--.

COLUMN 22, line 36, "novolak" should read --novolac--.

UNITED STATES PATENT AND TRADEMARK OFFICE
CERTIFICATE OF CORRECTION

PATENT NO. : 5,422,921
DATED : June 6, 1995
INVENTOR(S) : KEIKO CHIBA

It is certified that error appears in the above-indentified patent and that said Letters Patent is hereby corrected as shown below:

COLUMN 23, line 42 "Film" should read --film--.

COLUMN 24, line 13, "time" should read --the--;
    line 25, "Tungsten" should read --tungsten--; and
    line 67, "claim 13," should read --claim 14,--.

COLUMN 25, line 20, "claim 14" should read --claim 14,--;
    line 61, "the surface" should read --the one surface--; and
    line 62, "thereon." should read --thereon, to form a circuit pattern on the material to be exposed.--.

Signed and Sealed this

Twelfth Day of December, 1995

Attest:

BRUCE LEHMAN

*Attesting Officer*    *Commissioner of Patents and Trademarks*